US007312130B2

(12) United States Patent
Kim et al.

(10) Patent No.: US 7,312,130 B2
(45) Date of Patent: Dec. 25, 2007

(54) METHODS OF FORMING CAPACITOR STRUCTURES INCLUDING L-SHAPED CAVITIES

(75) Inventors: Dong-Chan Kim, Seoul (KR); Chang-Jin Kang, Gyeonggi-do (KR); Byeong-Yun Nam, Gyeonggi-do (KR); Kyeong-Koo Ghi, Seoul (KR); Eun-Ae Chung, Gyeonggi-do (KR); Sung-Il Cho, Seoul (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 242 days.

(21) Appl. No.: 10/977,385

(22) Filed: Oct. 29, 2004

(65) Prior Publication Data

US 2005/0112819 A1    May 26, 2005

(30) Foreign Application Priority Data

Nov. 21, 2003   (KR) .................... 10-2003-0083021

(51) Int. Cl.
   *H01L 21/20* (2006.01)
(52) U.S. Cl. .................. 438/397; 438/438; 438/239; 438/253; 438/254; 438/396; 438/381
(58) Field of Classification Search ............... 438/239, 438/253, 254, 396, 397, 381
   See application file for complete search history.

(56) References Cited

U.S. PATENT DOCUMENTS 6,080,632 A * 6/2000 Chao ................... 438/397
6,136,643 A    10/2000 Jeng et al.
6,156,608 A    12/2000 Chen
6,281,535 B1 * 8/2001 Ma et al. ................ 257/295
6,483,141 B2   11/2002 Sano
2003/0227045 A1 12/2003 Lee et al.

FOREIGN PATENT DOCUMENTS

| JP | 2000-77622 | 3/2000 |
| KR | 10-2003-0001917 | 1/2003 |
| KR | 10-2003-0001918 | 1/2003 |

OTHER PUBLICATIONS

English Translation of Korean Office Action for Application No. 10/2002-0029494 dated May 28, 2004.

* cited by examiner

*Primary Examiner*—Long Pham
(74) *Attorney, Agent, or Firm*—Myers Bigel Sibley & Sajovec

(57) ABSTRACT

Methods of forming capacitor structures may include forming an insulating layer on a substrate, forming a first capacitor electrode on the insulating layer, forming a capacitor dielectric layer on portions of the first capacitor electrode, and forming a second capacitor electrode on the capacitor dielectric layer such that the capacitor dielectric layer is between the first and second capacitor electrodes. More particularly, the first capacitor electrode may define a cavity therein wherein the cavity has a first portion parallel with respect to the substrate and a second portion perpendicular with respect to the substrate. Related structures are also discussed.

22 Claims, 26 Drawing Sheets

METHODS OF FORMING CAPACITOR STRUCTURES INCLUDING L-SHAPED CAVITIES

RELATED APPLICATION

This application claims the benefit of and priority under 35 USC § 119 to Korean Patent Application No. 2003-83021 filed on Nov. 21, 2003, the disclosure of which is incorporated herein by reference in its entirety.

FIELD OF THE INVENTION

The present invention relates to integrated circuit devices, and more particularly to methods of forming capacitor structures for integrated circuit devices and related structures.

BACKGROUND

Demand for semiconductor devices providing higher integration densities and increased response speeds may continue to increase. Technologies of manufacturing a semiconductor device have thus been developed to increase integration densities, reliability, and response speeds.

More particularly dynamic random access memory (DRAM) devices are widely used. Each memory cell of a DRAM device may include one access transistor and one capacitor. As integration densities of a semiconductor device increase, a horizontal area of a substrate on which the capacitor is formed may be reduced. Forming a capacitor providing a high capacitance on a reduced area may thus be a technical challenge.

To increase a capacitance of a capacitor, a dielectric layer having a relatively high dielectric constant may be used and/or an effective area of a capacitor electrode may be increased. Stacked capacitor structures and trench capacitor structures have been developed to increase an effective area of the capacitor electrode. Moreover, stacked capacitor structures have been provided as cylinders. U.S. Pat. No. 6,136,643 discusses a method of forming a cylindrical capacitor. The disclosure of U.S. Pat. No. 6,136,643 is hereby incorporated herein in its entirety by reference.

A lower electrode of the cylindrical capacitor may be formed to have an increased height. As a height of a lower electrode is increased, however, an upper portion of a cylindrical lower electrode may lean or fall down thereby reducing yield due to contacts between adjacent lower electrodes. Increasing a height of a lower capacitor electrode may thus be limited.

SUMMARY OF THE INVENTION

According to embodiments of the present invention, a method of forming a capacitor structure may include forming an insulating layer on a substrate, forming a first capacitor electrode on the insulating layer, forming a capacitor dielectric layer on portions of the first capacitor electrode, and forming a second capacitor electrode on the capacitor dielectric layer such that the capacitor dielectric layer is between the first and second capacitor electrodes. More particularly, the first capacitor electrode may define a cavity therein with the cavity having a first portion parallel with respect to the substrate and a second portion perpendicular with respect to the substrate.

Forming the first capacitor electrode may include forming a buffer pattern on the insulating layer, forming a mold layer on the buffer pattern wherein the mold layer and the buffer pattern comprise different materials, and forming a hole in the mold layer exposing a portion of the buffer pattern thereby defining a first cavity. After forming the hole in the mold layer, the buffer pattern may be selectively removed while maintaining the mold layer, thereby defining a second cavity coupled to the first cavity. The first capacitor electrode may be formed on inner surfaces of the first and second cavities, and the mold layer may be removed after forming the first capacitor electrode.

Forming the first capacitor electrode may also include forming a conductive layer on the inner surfaces of the first and second cavities and on a surface of the mold layer, and forming a sacrificial layer on the conductive layer inside the first and second cavities and on the surface of the mold layer. Portions of the sacrificial layer and the conductive layer may be removed to expose portions of the mold layer, and the mold layer and the sacrificial layer may be removed. In addition, forming the buffer pattern may include forming a buffer layer on the insulating layer, and patterning the buffer layer using photolithography. In an alternative, forming the buffer pattern may include forming a silicon oxide layer on the insulating layer, removing portions of the silicon oxide layer thereby exposing portions of the insulating layer, forming a buffer layer on the silicon oxide layer and on exposed portions of the insulating layer, and removing portions of the buffer layer to expose the silicon oxide layer while maintaining portions of the buffer layer on the insulating layer to provide the buffer pattern.

Selectively removing the buffer pattern may include isotropically etching the buffer pattern. More particularly, isotropically etching the buffer pattern may include isotropically etching the buffer pattern using an etchant that provides an etching selectivity of at least about 100:1 for the buffer pattern with respect to the mold layer. For example, the buffer pattern may include silicon germanium. Moreover, forming the mold layer may be preceded by forming an etch stopping layer on the buffer pattern wherein the etch stopping layer and the mold layer comprise different materials and wherein the etch stopping layer and the buffer pattern comprise different materials. For example, the etch stopping layer may be a layer of silicon nitride. In addition, the cavity of the first capacitor electrode may be "L" shaped, and the second portion of the cavity defined by the first capacitor electrode may be cylindrical.

Forming the first capacitor electrode may be preceded by forming a storage node contact through the insulating layer wherein the storage node contact provides electrical connection between the first capacitor electrode and the substrate. The storage node contact may provide electrical connection between the first capacitor electrode and a source/drain region of a memory cell access transistor. Moreover, forming the insulating layer may be preceded by forming a second insulating layer between the first insulating layer and the substrate, and forming a bit line between the first and second insulating layers with the bit line being electrically connected to a second source/drain region of the memory cell access transistor. In addition, the second portion of the cavity defined by the first capacitor electrode may be offset with respect to the storage node contact.

According to additional embodiments of the present invention, a method of forming a capacitor structure may include forming an insulating layer on a substrate, forming a buffer pattern on the insulating layer, and forming a mold layer on the buffer pattern wherein the mold layer and the buffer pattern comprise different materials. A hole may be formed in the mold layer exposing a portion of the buffer pattern thereby defining a first cavity. After forming the hole in the mold layer, the buffer pattern may be selectively etched while maintaining the mold layer thereby defining a second cavity coupled to the first cavity. More particularly, the buffer layer may be selectively etched using an etchant providing an etch selectivity of at least about 100 to 1 with respect to the mold oxide layer. A first capacitor electrode may be formed on inner surfaces of the first and second cavities, and the mold layer may be removed after forming the first capacitor electrode. A capacitor dielectric layer may be formed on portions of the first capacitor electrode, and a second capacitor electrode may be formed on the capacitor dielectric layer so that the capacitor dielectric layer is between the first and second capacitor electrodes. More particularly, the buffer pattern may include silicon germanium, and the mold layer may comprise oxide such as silicon oxide.

According to still additional embodiments of the present invention, a capacitor structure for an integrated circuit device may include an insulating layer on a substrate, a first capacitor electrode on the insulating layer, a capacitor dielectric layer on portions of the first capacitor electrode, and a second capacitor electrode on the capacitor dielectric layer such that the capacitor dielectric layer is between the first and second capacitor electrodes. More particularly, the first capacitor electrode may define a cavity therein with the cavity having a first portion parallel with respect to the substrate and a second portion perpendicular with respect to the substrate. For example, the cavity of the first capacitor electrode may be "L" shaped, and the second portion of the cavity defined by the first capacitor electrode may be cylindrical.

The capacitor structure may also include an etch stopping layer on portions of the first capacitor electrode defining the first portion of the cavity parallel with respect to the substrate wherein the etch stopping layer is between portions of the first capacitor electrode and the capacitor dielectric layer. The etch stopping layer may include silicon nitride. The capacitor structure may also include a second insulating layer on the first insulating layer adjacent the first capacitor electrode with the second insulating layer being between portions of the etch stopping layer and the first insulating layer. In an alternative, the etch stopping layer may extend along exterior sidewalls of portions of the first capacitor electrode defining the first portion of the cavity and on the first insulating layer.

In addition, a storage node contact may be provided through the insulating layer wherein the storage node contact provides electrical connection between the first capacitor electrode and the substrate. The storage node contact may provide electrical connection between the first capacitor electrode and a source/drain region of a memory cell access transistor. In addition, a second insulating layer may be provided between the first insulating layer and the substrate, and a bit line may be provided between the first and second insulating layers wherein the bit line is electrically connected to a second source/drain region of the memory cell access transistor. Moreover, the second portion of the cavity defined by the first capacitor electrode may be offset with respect to the storage node contact.

Cylindrical capacitors may be provided according to embodiments of the present invention that reduce defects resulting from leaning of lower capacitor electrode. Methods of manufacturing cylindrical capacitors that reduce defects resulting from leaning of lower electrodes may also be provided according to embodiments of the present invention.

In accordance with some embodiments of the present invention, a capacitor may include an insulating layer formed on a substrate and a storage contact formed through the insulating layer. A cylindrical lower electrode may include a lower portion having a first region contacting the storage contact and a second region horizontally extended from the first region on the insulating layer, and an upper portion vertically extended from the second region of the lower portion. A dielectric layer may be formed on the cylindrical lower electrode, and an upper electrode may be formed on the dielectric layer.

An etch stopping layer may cover the first region of the lower portion of the lower electrode. Moreover, the etch stopping layer and the insulating layer may enclose the lower portion of the cylindrical lower electrode. Alternatively, the etch stopping layer may enclose the lower portion of the cylindrical lower electrode.

The lower portion of the cylindrical lower electrode may be wider than the upper portion of the cylindrical lower electrode. As a result, the cylindrical lower electrode may be supported more firmly, thereby reducing leaning of the cylindrical lower electrode. Also, as the lower portion of the lower electrode is extended, a capacitance of a capacitor may be increased, In accordance with other embodiments of the present invention, a method of manufacturing a capacitor may include forming an insulating layer on a substrate, and forming a storage contact through the insulating layer to make contact with a contact forming region of the substrate. A cylindrical lower electrode may be formed on the storage contact and the insulating layer. The cylindrical lower electrode may include a lower portion having a first region contacting the storage contact and a second region horizontally extended from the first region on the insulating layer, and an upper portion vertically extended from the second region of the lower portion. A dielectric layer may be formed on the cylindrical lower electrode. An upper electrode may then be formed on the dielectric layer.

A buffer pattern may be formed on the storage contact and the insulating layer, and a mold oxide layer may be formed on the buffer pattern. The mold oxide layer may be partially etched to form a preliminary opening that partially exposes the buffer pattern. Then, the buffer pattern may be selectively removed to form an opening for forming a cylindrical lower electrode. Here, the opening may have an upper portion and an extended lower portion. Conductive material for the lower electrode may be deposited on an inside of the opening.

The buffer pattern may be formed using a material having an etching selectivity of more than about 1:100 relative to the mold oxide layer. In particular, the buffer pattern may be formed using silicon germanium. Additionally, an etch stopping layer may be formed on the buffer pattern.

In accordance with still other embodiments of the present invention, methods of manufacturing a capacitor may include forming an insulating layer on a substrate including a contact forming region, and forming a buffer pattern contacting the contact region through the insulating layer. A mold oxide layer may be formed on the insulating layer and the buffer pattern. The mold oxide layer may be etched to form a preliminary opening exposing the buffer pattern, and the buffer pattern may be selectively etched by an isotropic etching process to form an extended opening. A cylindrical lower electrode may be formed on the contact forming region and on an inside of the extended opening. The remaining mold oxide layer may then be removed. A dielectric layer may be formed on the cylindrical lower electrode, and an upper electrode may then be formed on the dielectric layer.

According to embodiments of the present invention, the cylindrical lower electrode may be supported relatively firmly to thereby reduce leaning of the cylindrical lower electrode. Also, as the lower portion of the cylindrical lower electrode is extended, a capacitance of a capacitor may increase.

BRIEF DESCRIPTION OF THE DRAWINGS

FIGS. 3A to 3K are cross-sectional views illustrating steps of manufacturing capacitor structures of FIG. 1.

FIGS. 4A to 4I are cross-sectional views illustrating steps of manufacturing capacitors of DRAM devices according to second embodiments of the present invention.

DETAILED DESCRIPTION

Figure 1:
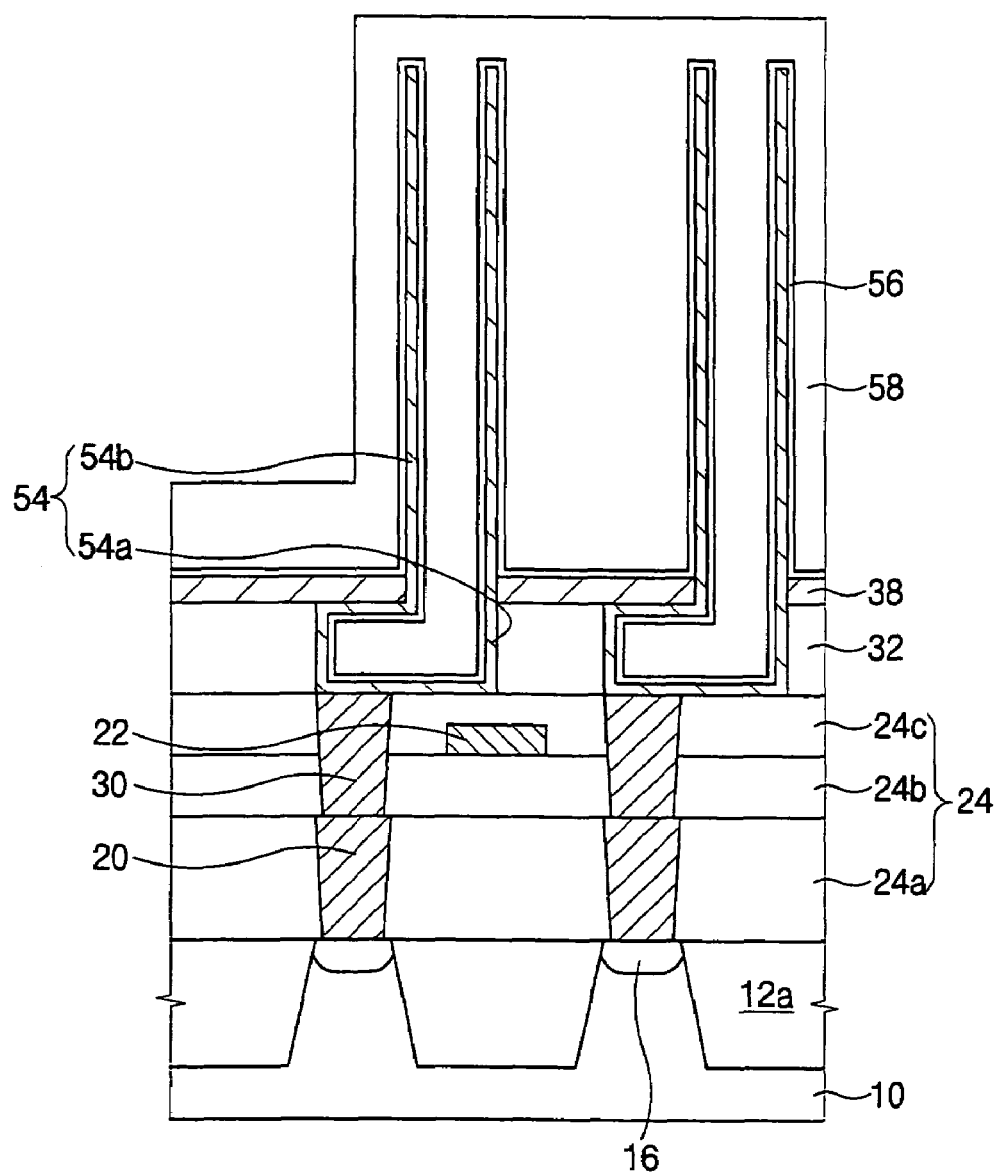
FIG. 1 is a cross-sectional view illustrating capacitors of DRAM devices according to first embodiments of the present invention.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

In the drawings, the thickness of layers and regions are exaggerated for clarity. It will also be understood that when an element such as a layer, region or substrate is referred to as being on another element, it can be directly on the other element or intervening elements may also be present. In contrast, if an element such as a layer, region or substrate is referred to as being directly on another element, then no other intervening elements are present. As used herein, the term and/or includes any and all combinations of one or more of the associated listed items.

Furthermore, relative terms, such as beneath, upper, and/or lower may be used herein to describe one element's relationship to another element as illustrated in the figures. It will be understood that relative terms are intended to encompass different orientations of the device in addition to the orientation depicted in the figures. For example, if the device in one of the figures is turned over, elements described as below other elements would then be oriented above the other elements. The exemplary term below, can therefore, encompasses both an orientation of above and below; the exemplary term lower, can therefore, encompass both an orientation of lower and upper; and the exemplary term upper, can therefore, encompass both an orientation of upper and lower.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section could be termed a first region, layer or section without departing from the teachings of the present invention. Like numbers refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that may result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the precise shape of a region of a device and are not intended to limit the scope of the present invention.

Figure 2:
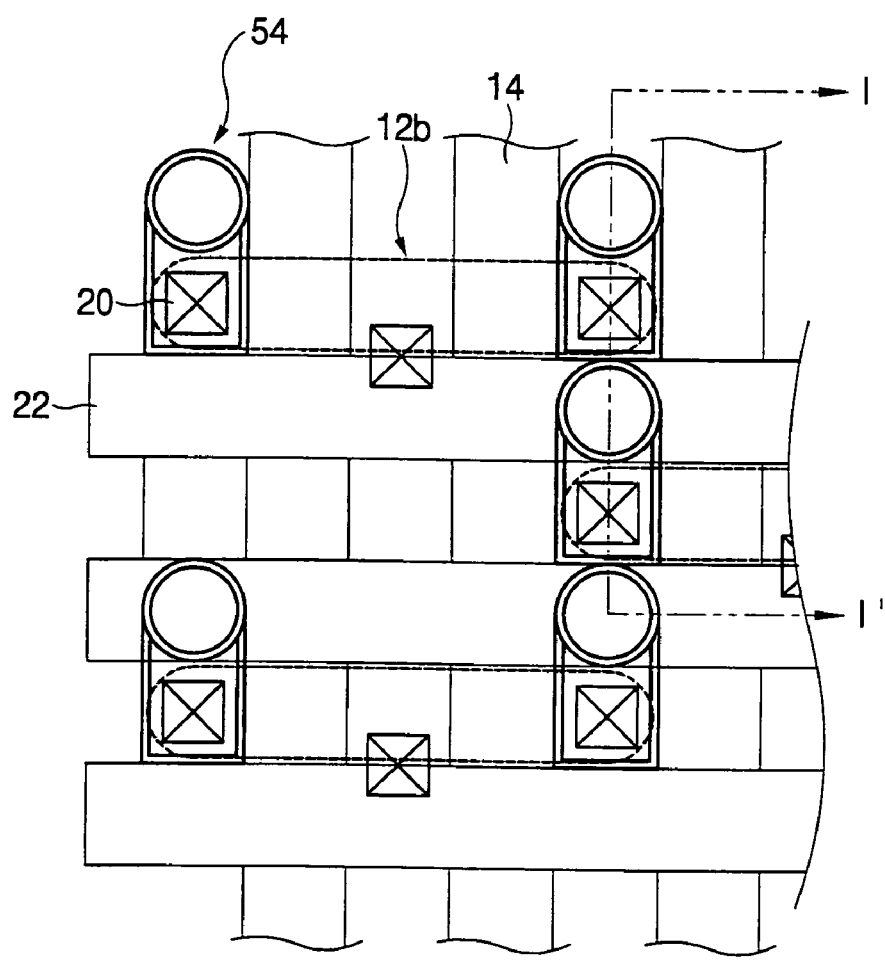
FIG. 2 is a plan view illustrating capacitor structures of FIG. 1.

FIG. 1 is a cross-sectional view illustrating a capacitor structure for a DRAM device according to first embodiments of the present invention, and FIG. 2 is a plan view illustrating the capacitor structure of FIG. 1. Referring to FIGS. 1 and 2, an insulating layer 24 may be formed on a substrate 10 including transistors (not shown). A bit line 22 may be connected to drain regions of respective transistors, and pad electrodes 20 may be connected to source regions of respective transistors.

Storage contacts 30 may be connected to source regions of respective transistors through the insulating layer 24. The storage contacts 30 may include a metal material such as polysilicon or tungsten. Cylindrical lower electrodes 54 of respective capacitors may be provided on the storage contacts 30 and the insulating layer 24. In particular, each cylindrical lower electrode 54 may include a lower portion 54a having a first region contacting the respective storage contact 30 and a second region horizontally extending from the first region on the insulating layer. Each cylindrical lower electrode may also include an upper portion 54b vertically extending from the second region of the lower portion 54a. Hence, each cylindrical lower electrode 54 may include an extended lower portion 54a that is laterally offset with respect to the upper portion 54b. Accordingly, the upper portion 54b of each cylindrical lower electrode 54 may be disposed regardless of a position of the respective storage contact 30 so that the upper portion 54b of the cylindrical lower electrode 54 may be arranged to provide an increased interval between upper portions 54b of the cylindrical lower electrodes 54. Moreover, the upper portion 54b of the lower electrode may be laterally offset from the respective storage contact 30.

The lower portion 54a of each cylindrical lower electrode 54 may be supported by an etch stopping layer 38 and an insulating interlayer 32. In particular, the etch stopping layer 38 and the insulating interlayer 32 may enclose the lower portion 54a of the cylindrical lower electrode 54. The etch stopping layer 38 may include silicon nitride. Hence, the cylindrical lower electrode 54 may have a relatively stable structure. A dielectric layer 56 may be disposed on the cylindrical lower electrodes 54, and an upper electrode 58 may cover the dielectric layer 56.

A lower portion of each cylindrical lower electrode 54 may be extended so that an effective area of the lower electrode is increased and a capacitance of the capacitor may be increased. Also, the structure of the cylindrical lower electrodes 54 may be relatively stable so that leaning of the lower electrode may be reduced. Defects due to contact between upper portions of adjacent cylindrical lower electrodes may be reduced.

FIGS. 3A to 3K are cross-sectional views illustrating steps of manufacturing capacitors of a DRAM device according to first embodiments of the present invention. FIGS. 3A to 3K are cross-sectional views along a line parallel to I-I' line of FIG. 2.

Figure 3A:
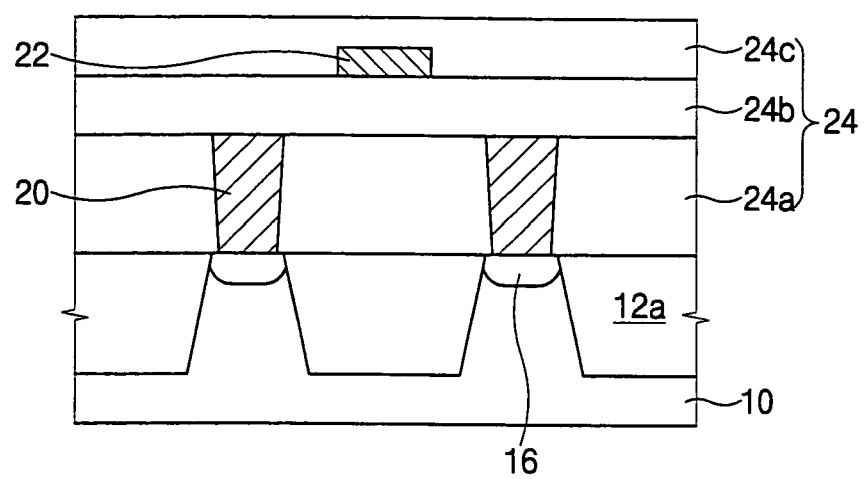

Referring to FIGS. 2 and 3A, a semiconductor substrate 10 is divided into active regions 12b and field regions 12a using a device isolation process such as a shallow trench isolation (STI) process or a local oxidation of silicon (LOCOS) process. Moreover, gate electrodes 14 and source/drain regions 16 may be formed on the substrate 10 to provide memory access transistors. An insulating layer 24 may be formed on the transistors. Moreover, pad electrodes 20 may be formed in via holes through the insulating layer 24a, and a bit line 22 may be formed on the insulating layer 24b.

More particularly, after forming a thin gate oxide layer (not shown) on the surface of the active region using a thermal oxidation process, gate electrodes 14 of the transistors may be formed as word lines on the thin gate oxide layer. The gate electrodes 14 may have a polycide structure that includes a polysilicon film doped with a relatively high concentration of impurities and a tungsten silicide film on the doped polysilicon film. Here, the polysilicon film may be doped with impurities using a doping process such as a diffusion process, an ion implanting process, and/or an in-situ doping process. An oxide layer and/or a nitride layer may be formed on the gate electrode 14, and spacers (not shown) including oxide and/or nitride may be formed on sidewalls of the gate electrode 14. Impurities may be implanted into surface portions of the substrate 10 exposed between the gate electrodes 14 using the gate electrodes 14 as a mask, thereby forming source/drain regions at surface portions of device regions. Some of the doped regions may correspond to capacitor contact regions 16 that will be electrically connected with storage electrodes of respective capacitors, and others of the doped regions may correspond to bit line contact regions that will be in contact with corresponding bit lines. Hereafter, a source region indicates a capacitor connection region, and a drain region indicates a bit line connection region.

After a first insulating layer 24a is formed on the transistor and the substrate 10, contact holes (not shown) exposing respective source/drain regions may be formed using a photolithography process. After a doped polysilicon layer is formed on an inside of the contact holes and on the first insulating layer 24a, the doped polysilicon layer is polished to form pad electrodes 20 electrically connected with respective source/drain regions. After a second insulating layer 24b is formed on the pad electrodes 20 and the first insulating layer 24a, the second insulating layer 24b may be planarized.

Subsequently, portions of the second insulating layer 24b and the first insulating layer 24a may be etched to form a bit line contact holes (not shown) exposing the respective bit line connection regions, and bit line contact pads may be formed in contact with the bit line connection regions corresponding to the drain regions. Conductive material may be deposited on the second insulating layer 24b to fill the bit line contact holes and then, predetermined portions of the deposited conductive material may be patterned, thereby forming bit lines 22 that deliver electrical signals to bit line connection regions (i.e. drain regions) of respective DRAM cells. A third insulating layer 24c may be formed on the second insulating layer 24b and the bit lines 22 to cover the bit lines 22.

Figure 3B:
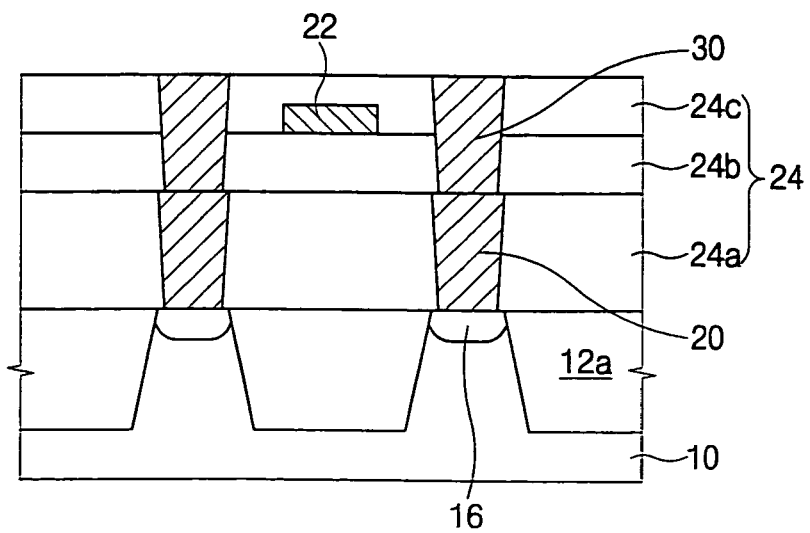

Referring to FIG. 3B, portions of the third insulating layer 24c and the second insulating layer 24b may be etched to form storage contact holes exposing respective pad electrodes 20. Here, the pad electrodes 20 may be in contact with respective capacitor contact regions corresponding to the source regions. Conductive material may be deposited on the third insulating layer 24c to fill the storage contact holes, and the deposited conductive material may be polished to form storage contacts 30. The conductive material may include polysilicon material and/or metal material. The storage contacts 30 may be aligned to the pad electrodes 20 disposed under the storage contacts, and electrically connected to the pad electrodes 20.

Figure 3C:
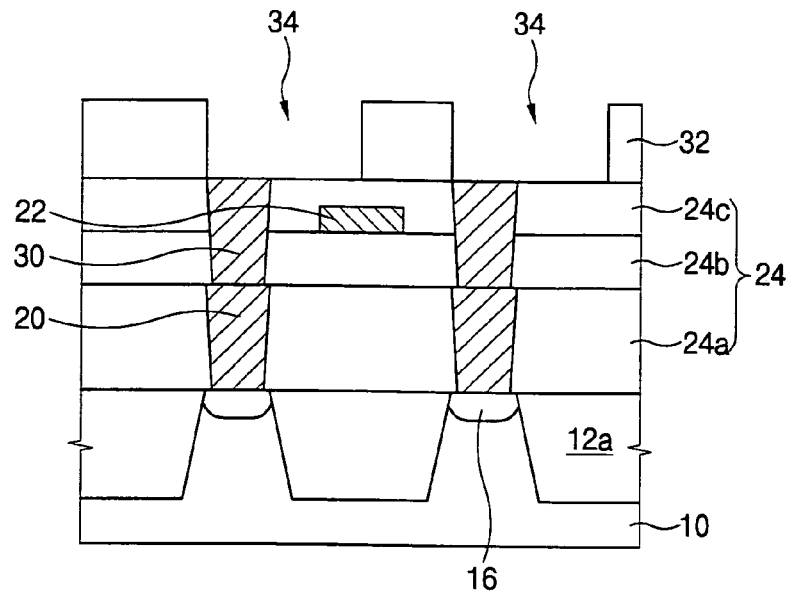

Referring to FIG. 3C, an insulating interlayer 32 may be formed on the storage contacts 30 and the third insulating layer 24c. A height of extended lower portions of subsequently formed cylindrical lower electrodes may be determined by a thickness of the insulating interlayer 32. Thus, heights of cylindrical lower electrodes and capacitances may be controlled by controlling a thickness of the insulating interlayer 32.

Portion of the insulating interlayer 32 may then be etched to form first openings 34 exposing respective storage contacts 30 and exposing portions of the third insulating layer 24c extending from the storage contacts 30. The first openings 34 define regions on which the lower electrodes are formed in a subsequent step.

Figure 3D:
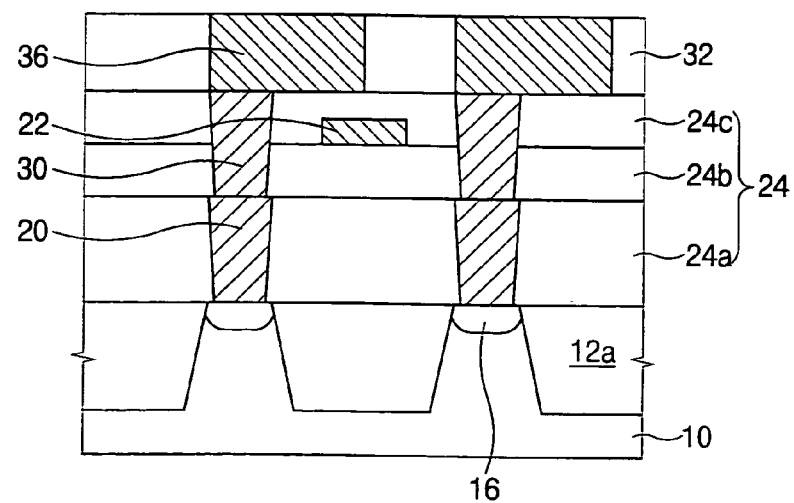

Referring to FIG. 3D, a buffer layer filling the first openings 34 may be formed, and the buffer layer may be planarized to expose surface portions of the insulating interlayer 32 so that buffer patterns 36 are connected to respective storage contacts 30. The buffer patterns 36 may include a material having an etching selectivity of greater than or equal to about 100:1 with respect to silicon oxide. More particularly, an etching selectivity of buffer pattern material with respect to silicon oxide may be greater than or equal to about 500:1. For example, the buffer layer may be formed using silicon germanium. Silicon germanium may provide an etching selectivity of greater than or equal to about 500:1 with respect to silicon oxide under some etching conditions. If an isotropic etching selectivity between the buffer pattern and silicon oxide is relatively small, forming the openings for lower electrodes having a desired profile may be difficult.

Figure 3E:
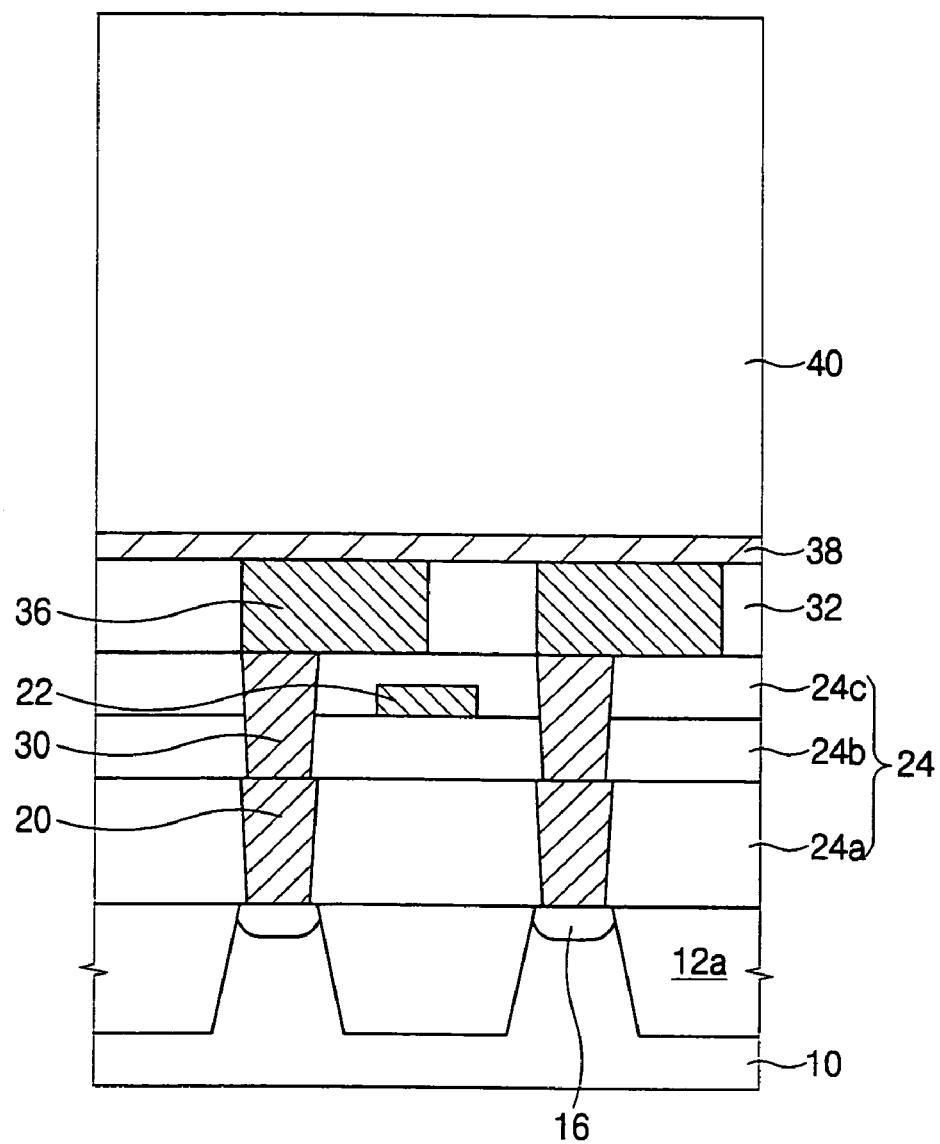

Referring to FIG. 3E, silicon nitride may be deposited to form an etch stopping layer 38 on the buffer pattern 36 and the insulating interlayer 32. Then, a mold oxide layer 40 may be formed on the etch stopping layer 38. A height of an upper portion of a subsequently formed cylindrical lower electrode may be determined by a thickness of the mold oxide layer 40. Here, the mold oxide layer 40 may be formed to have a thickness of more than about 10000 Å.

Figure 3F:
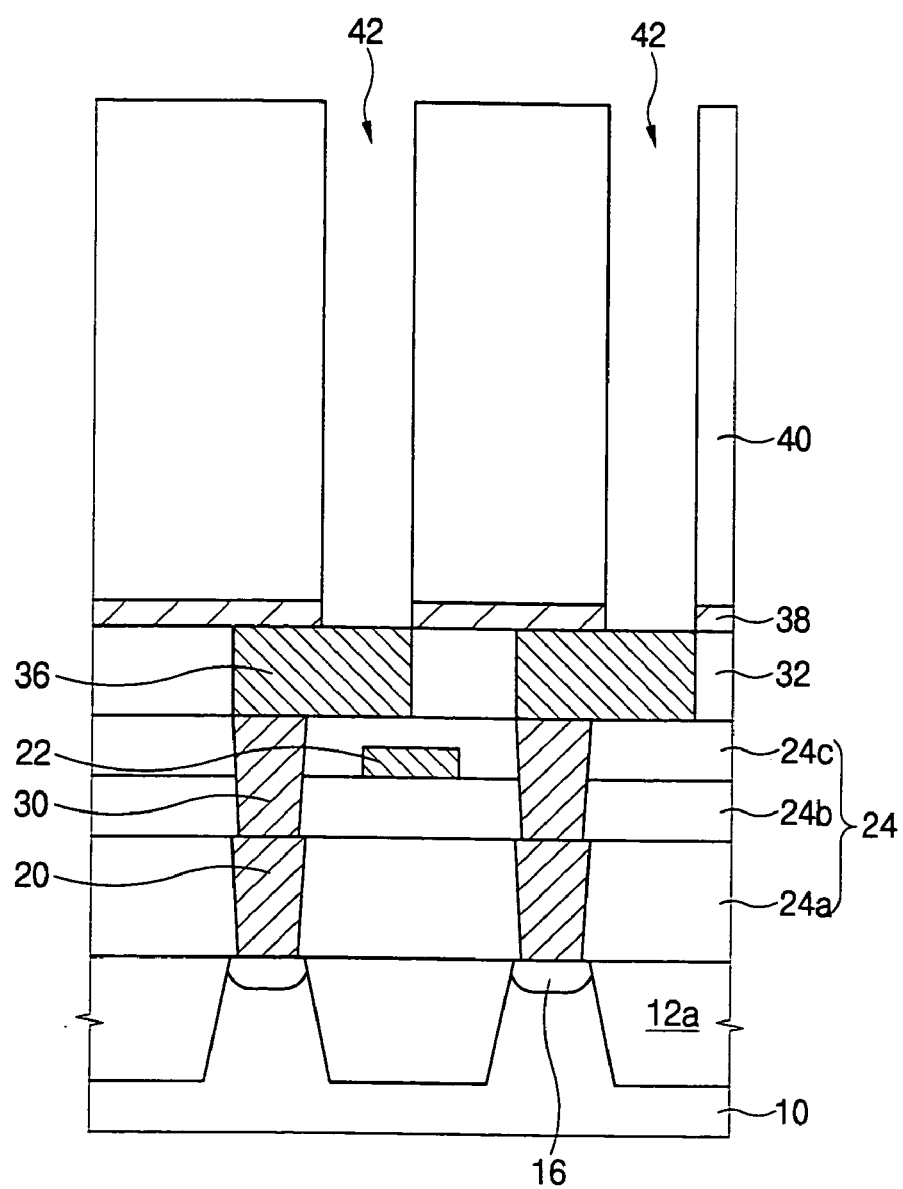

Referring to FIG. 3F, after etching portions of the mold oxide layer 40, the etch stopping layer 38 may be etched to form second openings 42 exposing a predetermined portion of the buffer pattern 36.

Positions of the upper portions of the cylindrical lower electrodes are determined by positions of the second openings 42. Thus, the second openings 42 may be disposed to have increased intervals between adjacent ones of the second openings 42. As illustrated in FIG. 2, upper portions of the cylindrical lower electrodes 54 may be formed to extend vertically from the second region of the lower portion. Here, a lower portion includes a first region contacting the storage contact and a second region extending horizontally from the first region. Thus, an interval between adjacent upper portions of the lower electrodes may be increased.

Figure 3G:
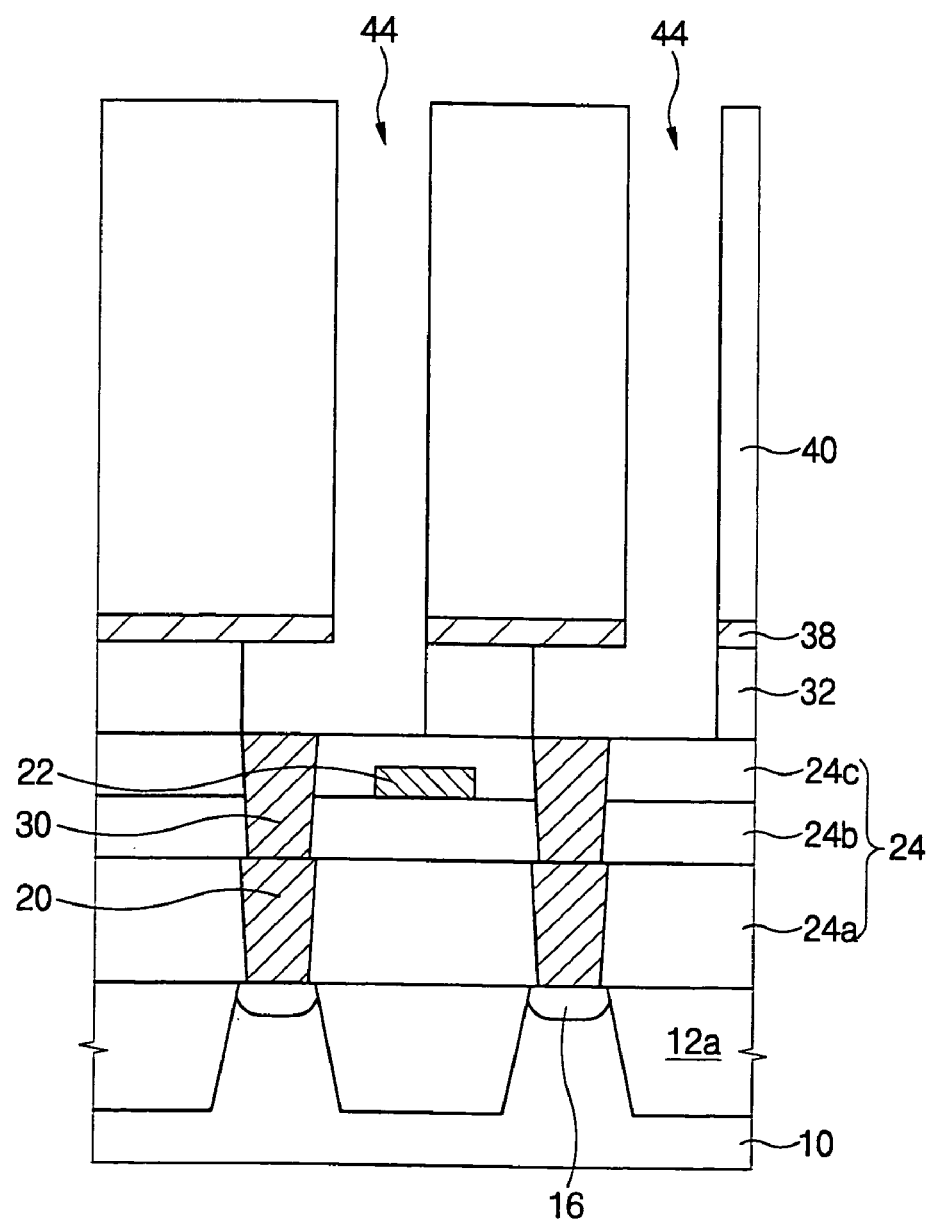

Referring to FIG. 3G, portions of the buffer patterns 36 may be exposed by the second openings 42, and the buffer patterns 36 may be selectively removed using an isotropic etching process to thereby form third openings 44 having laterally extended lower portions. Lower electrodes may then be formed inside the third openings 44, profiles inside the third openings 44 may define profiles of the resulting lower electrodes. The buffer patterns 36 may thus be etched while the mold oxide layer 40 and the insulating interlayer 32 are maintained without significant etching. As an etching selectivity between the buffer patterns and silicon oxide may be greater than or equal to about 100:1, the third openings 44 having a desired profile may be provided.

The isotropic etching process may include a wet etching process and/or a chemical dry etching process. If the buffer patterns are formed using silicon germanium, the isotropic etching process may be performed using a wet etchant including hydrogen peroxide ($H_2O_2$) and acetic acid ($CH_3COOH$). Hydrogen fluoride (HF) may also be included in the wet etchant.

Figure 3H:
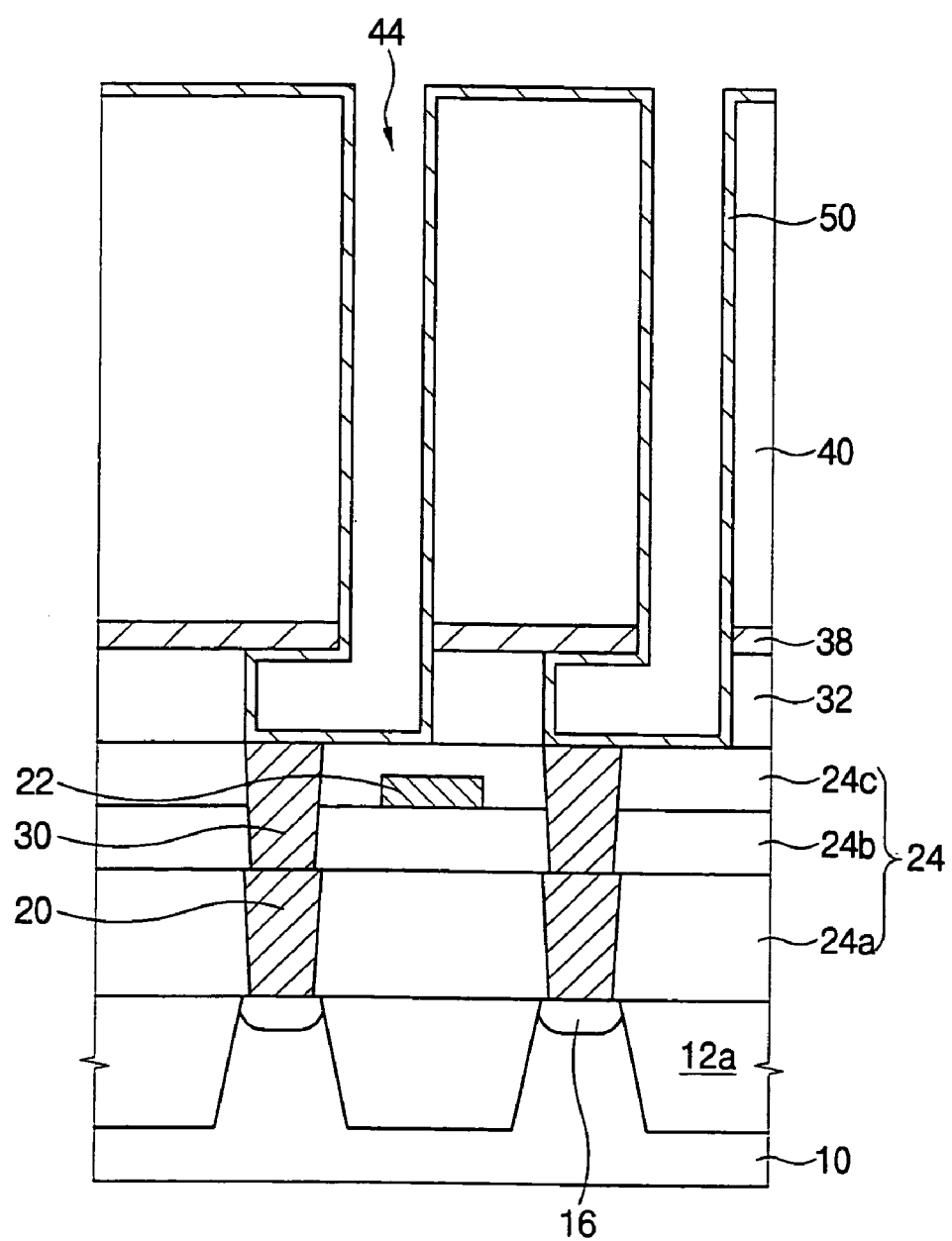
Figure 31:
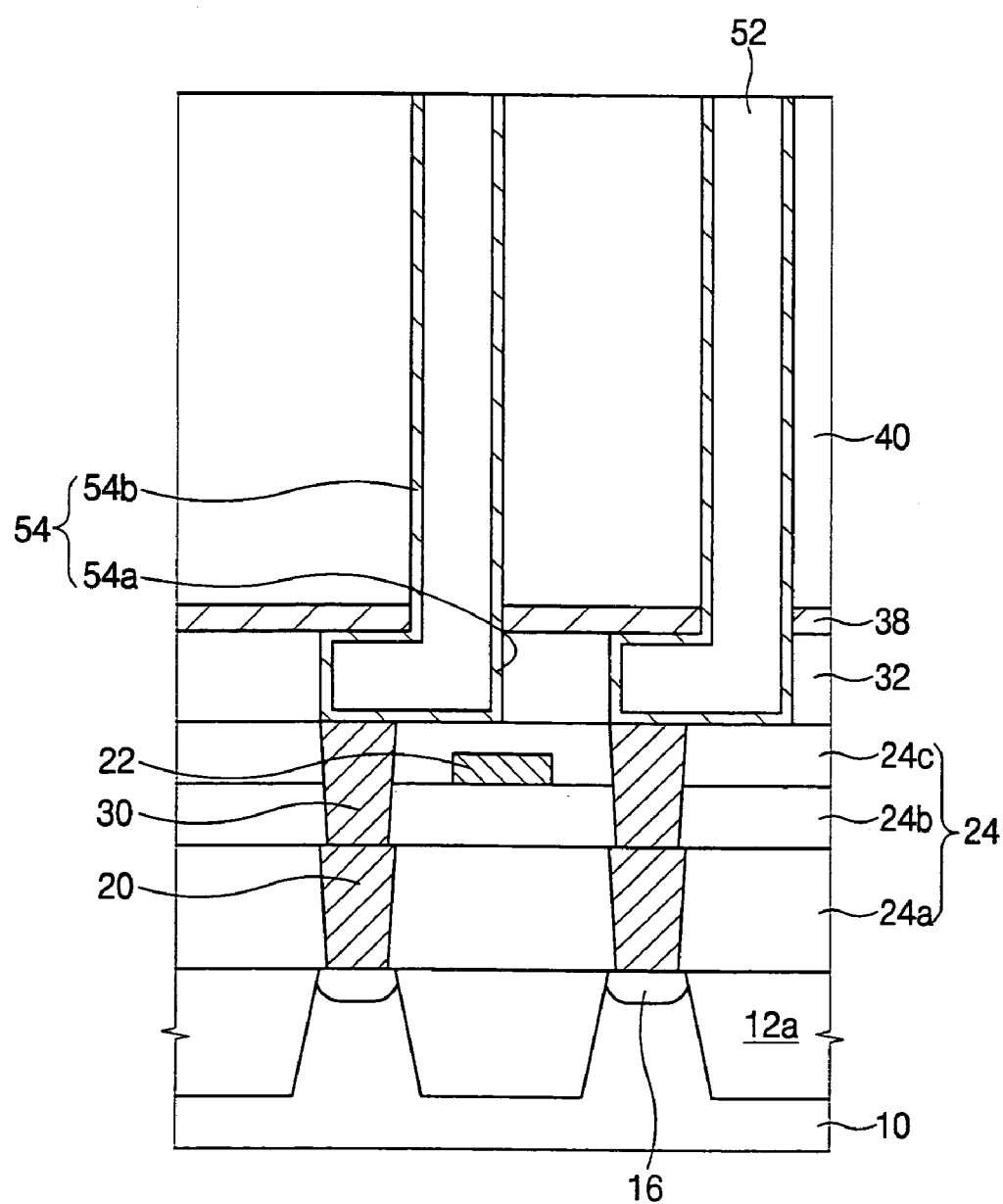

Referring to FIG. 3H, a lower electrode layer 50 may be formed on inside surfaces of the third openings 44 and on the mold oxide layer 40. The lower electrode layer 50 may include a conductive material providing a relatively high degree of step-coverage so that the lower electrode may be formed to provide a relatively uniform thickness on inside surfaces of the third openings 44 and on the mold oxide layer 40. In particular, the lower electrode layer 50 may include polysilicon.

Referring to FIG. 3I, a sacrificial oxide layer 52 may be formed to fill the third openings 44. Here, the lower electrode layer 50 may be formed on insides of the third openings 44 and on portions of the lower electrode layer 54 outside the third openings 44. Subsequently, the sacrificial oxide layer 52 and the lower electrode layer 50 may be polished back to expose portions of the mold oxide layer 40 outside the third openings 44 to form a cylindrical lower electrode 54.

Each cylindrical lower electrode 54 may include a lower portion 54a having a first region contacting the respective storage contact 30 and a second region extending horizontally from the first region on the insulating layer 24c, and an upper portion 54b extending vertically from the second region of the lower portion 54a.

Figure 3J:
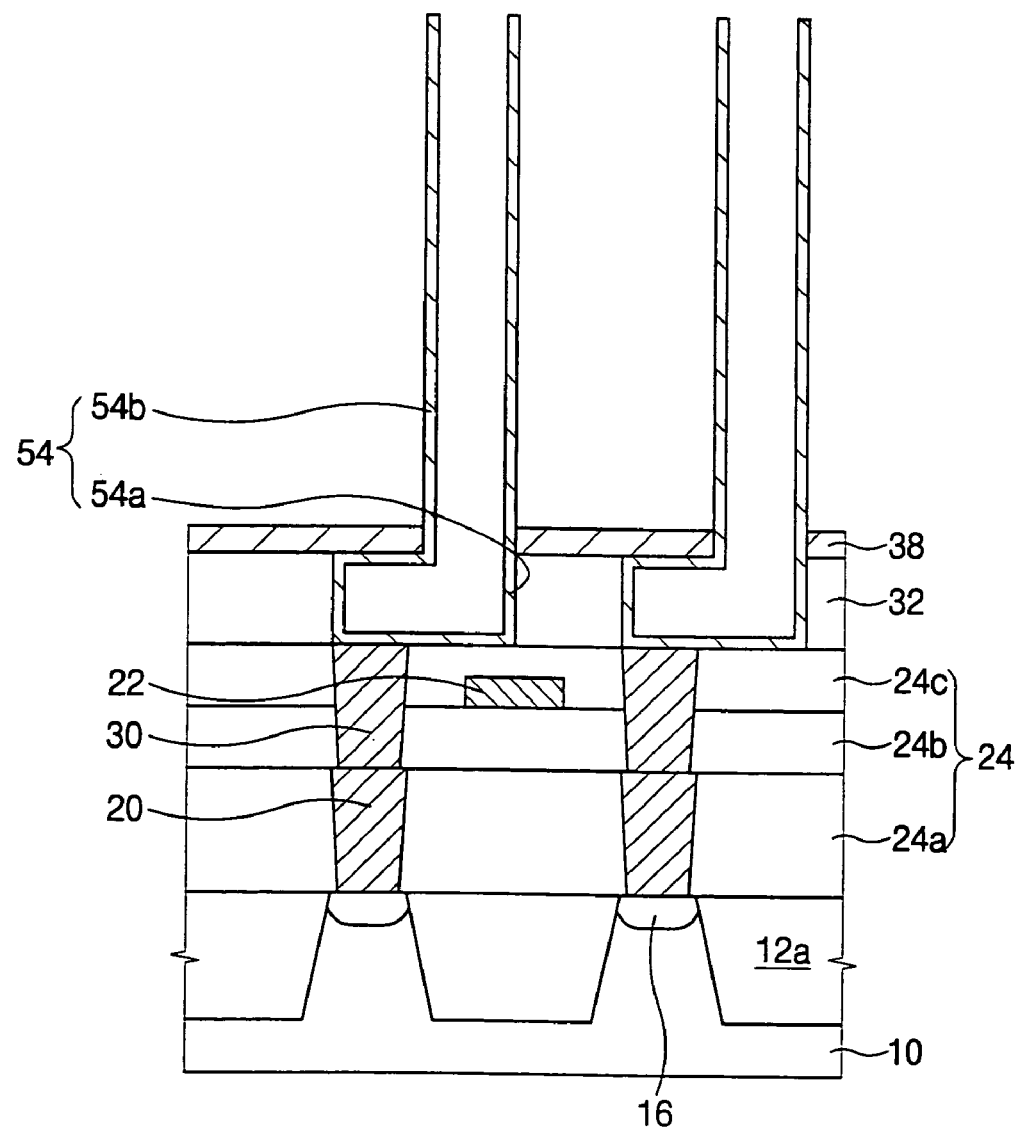

Referring to FIG. 3J, the sacrificial oxide layer 52 and the mold oxide layer 40 may be selectively removed using an isotropic etching process to expose the etch stopping layer 38. The isotropic etching process may include a wet etching process using an aqueous solution including hydrogen fluoride (HF) as an etchant. After performing the isotropic etching process, the etch stopping layer 38 and the insulating interlayer 32 may enclose the lower portions 54a of the cylindrical lower electrodes 54. As a result, the cylindrical lower electrodes 54 may have improved stability. Also, the upper portions 54b of the cylindrical lower electrodes may be exposed.

Upper portions 54b of the lower electrodes may be cylindrical or pipe shaped, while lower portions 54a of the lower electrode may have a different shape. As used herein, the term cylindrical does not require that sidewalls of upper portions 54b are perfectly parallel. For example, upper portions 54b may be somewhat conical with a diameter thereof increasing with increasing distance from the substrate.

Figure 3K:
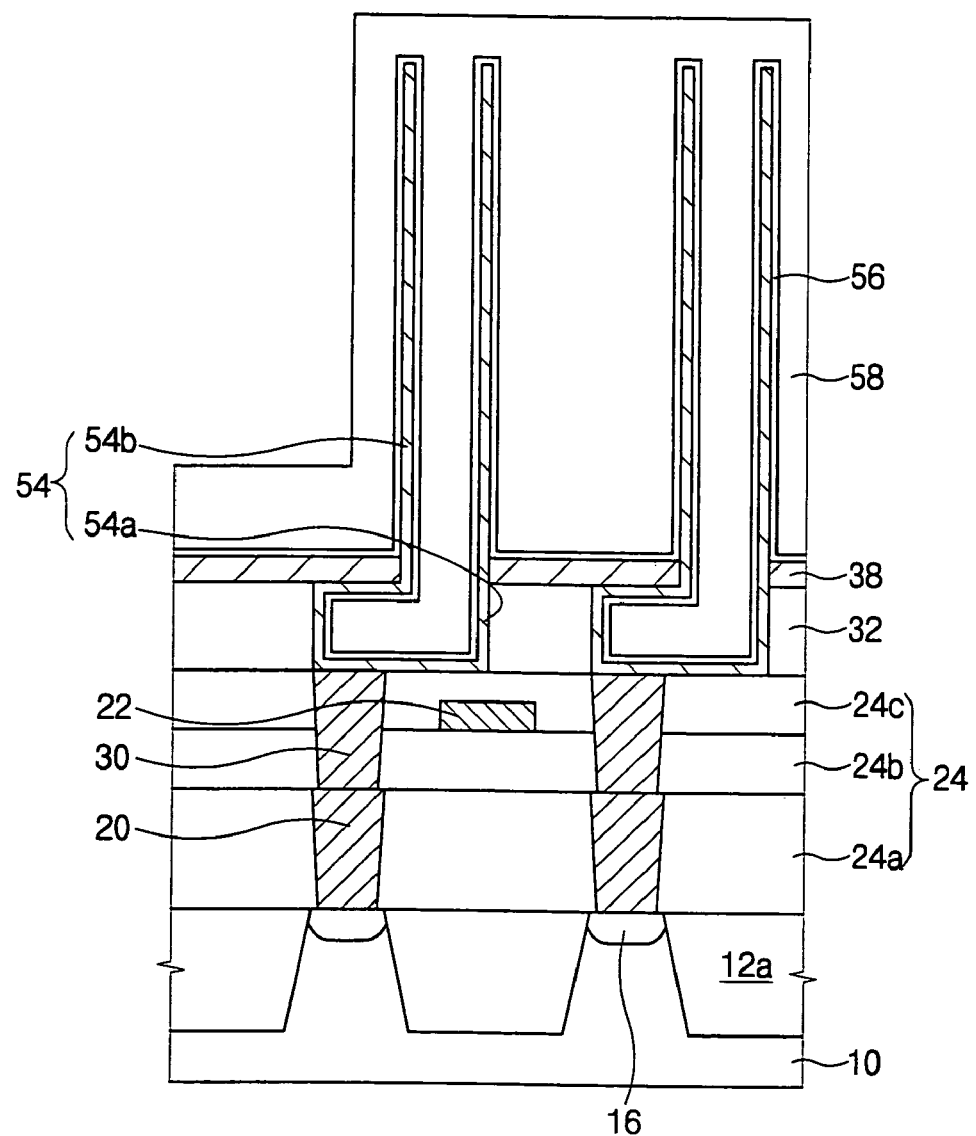

Referring to FIG. 3K, a dielectric layer 56 may be formed on the lower electrode 54 and the etch stopping layer 38. A sidewall of the upper portion 54b of the cylindrical lower electrode 54 on the outer surface of the cylindrical lower electrode 54 is exposed. A sidewall- of the whole cylindrical lower electrode 54 and the bottom face of the lower electrode 54 on the inner surface of the lower electrode 54 are exposed. The upper electrode 58 may then be formed on the dielectric layer 56.

When a capacitor of a semiconductor device formed using methods as discussed above has the lower electrode 54 including an extended lower portion 54a, a capacitance of the capacitor may be increased. Also, the structure of the cylindrical lower electrode 54 may have increased stability so that leaning of the lower electrode 54 may be reduced. Defects due to contact between upper portions 54b of adjacent cylindrical lower electrodes 54 may thus be reduced.

FIGS. 4A to 4I are cross-sectional views illustrating steps for manufacturing capacitors of DRAM devices according to second embodiments of the present invention. Methods according to second embodiments of the present invention may be substantially identical to methods according to first embodiments of the present invention with an exception of forming a buffer pattern.

Figure 4A:
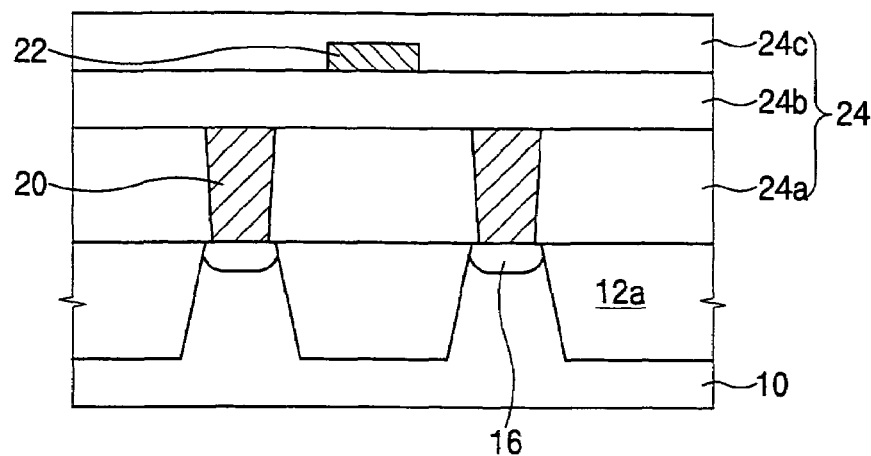

Referring to FIG. 4A, steps may be performed as discussed above with respect to FIG. 3A. More particularly, gate electrodes and source/drain regions 16 may be formed on the substrate 10 to provide memory cell access transistors. An insulating layer 24 may be formed on the transistors. Moreover, pad electrodes 20 may be formed in via holes through the insulating layer 24a and a bit line 22 may be formed on the insulating layer 24b.

An insulating layer 24c may be formed on the bit line 22 and the insulating layer 24b, and portions of the insulating layers 24b and 24c may be etched to form storage contact holes (not shown) exposing the pad electrodes 20. Here, the pad electrodes 20 may be connected to respective capacitor contact regions corresponding to source regions of respective memory cell access transistors. Conductive material may then be deposited on the insulating layer 24c to fill the storage contact holes, and the deposited conductive material may then be polished to form storage contacts 30.

Figure 4B:
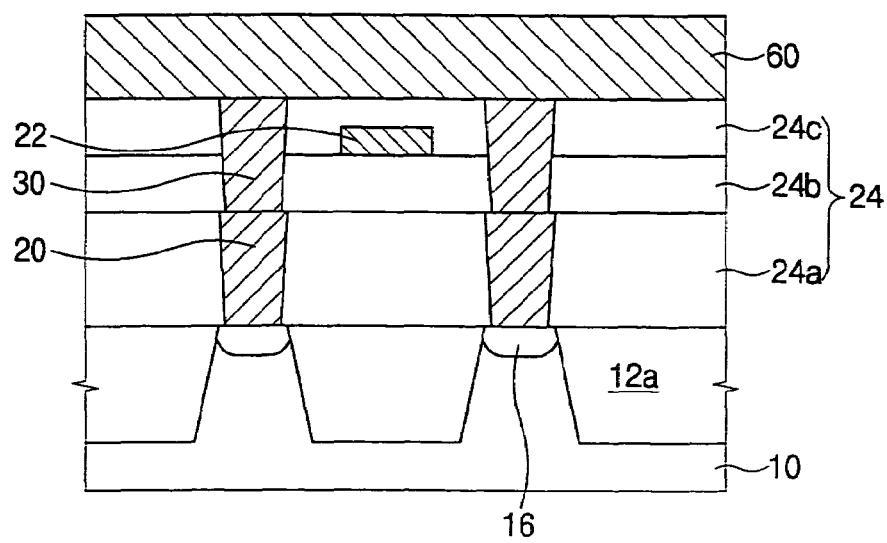

Referring to FIG. 4B, a buffer layer 60 may be formed on the storage contacts 30 and the insulating layer 24. The buffer layer 60 may include material having an etching selectivity greater than or equal to about 100:1 with respect to silicon oxide. Preferably, the etching selectivity between the buffer layer 60 and silicon oxide is greater than or equal to about 500:1. More particularly, the buffer layer 60 may be formed using silicon germanium.

Figure 4C:
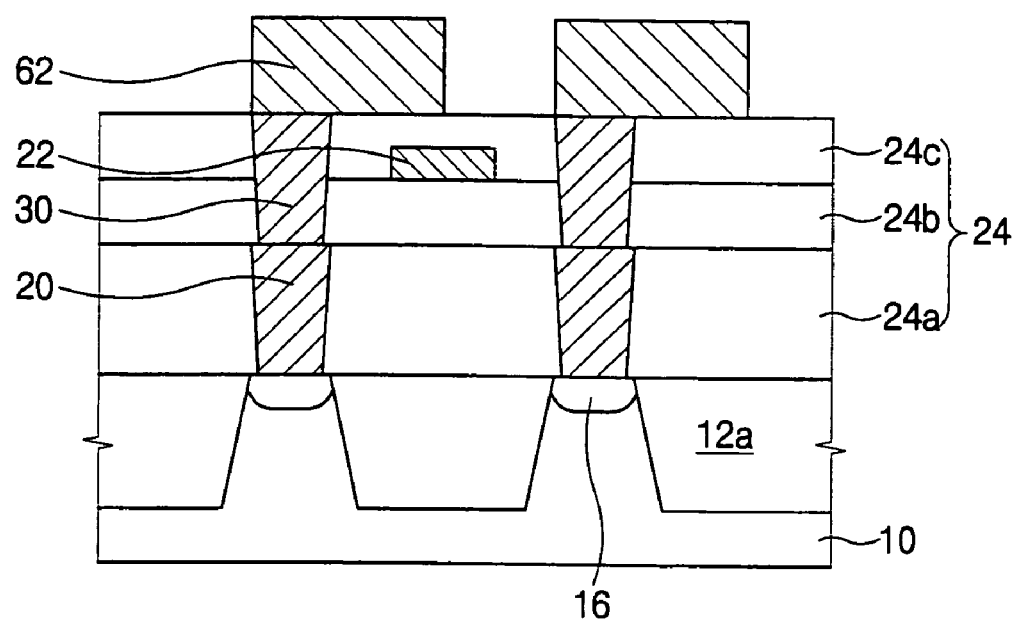

Referring to FIG. 4C, the buffer layer 60 is patterned using a photolithography process to form buffer patterns 62 on respective storage contacts 30 and the insulating layer 24 adjacent to the storage contacts 30. Bottom faces of the buffer patterns 62 may thus be wider than upper faces of the storage contacts 30.

The buffer patterns 62 define regions on which lower capacitor electrodes will be formed in subsequent steps. That is, the buffer patterns 62 may cover regions on which lower portions of the lower capacitor electrodes are disposed, and the buffer patterns may also cover upper faces of the storage contact 30.

A height of extended lower portions of subsequently formed cylindrical lower capacitor electrodes may be determined by a thickness of the buffer patterns 62. Heights and capacitances of the whole cylindrical lower capacitor electrodes may be controlled in part by controlling a thickness of the buffer patterns 62.

Figure 4D:
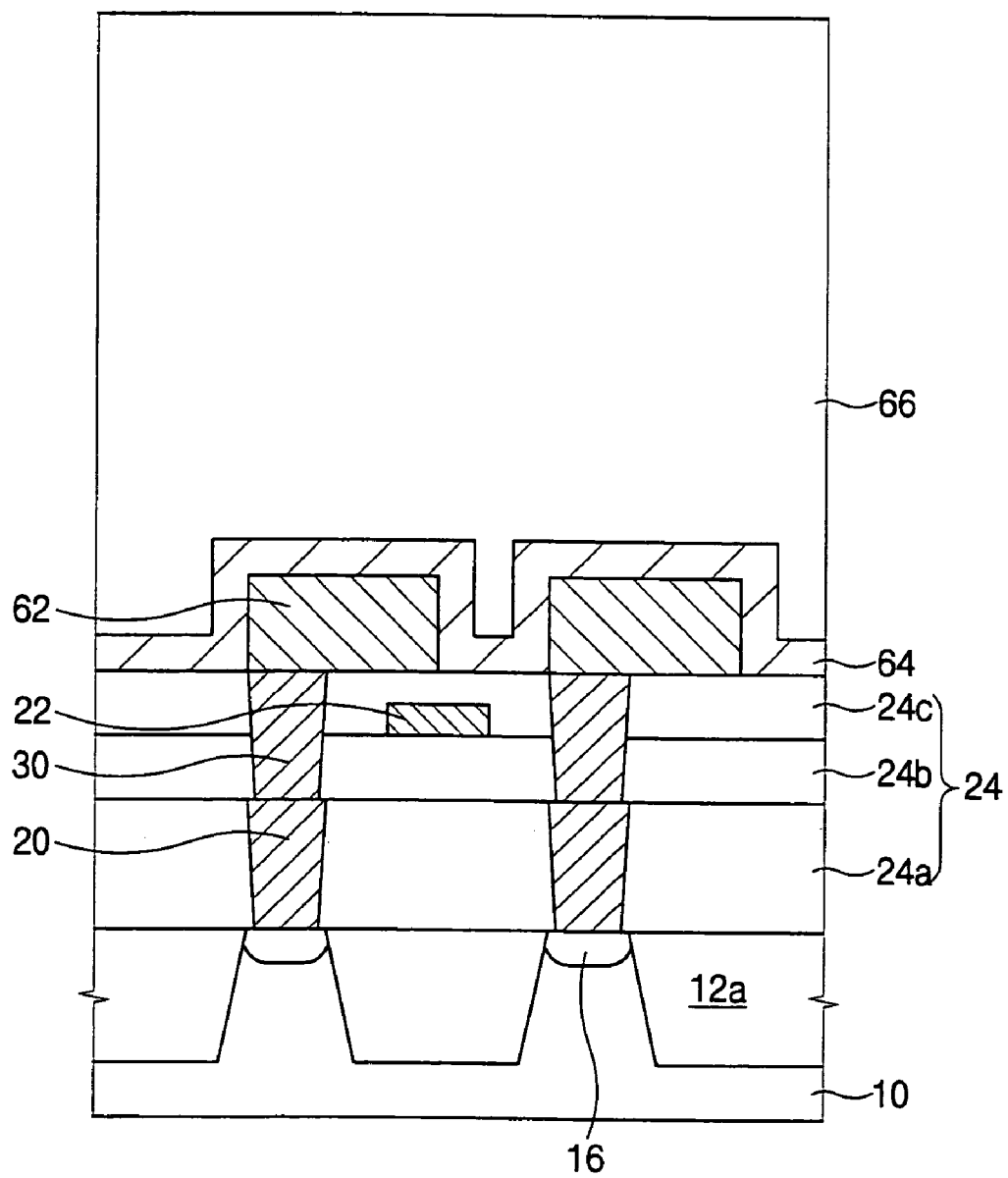
Figure 4E:
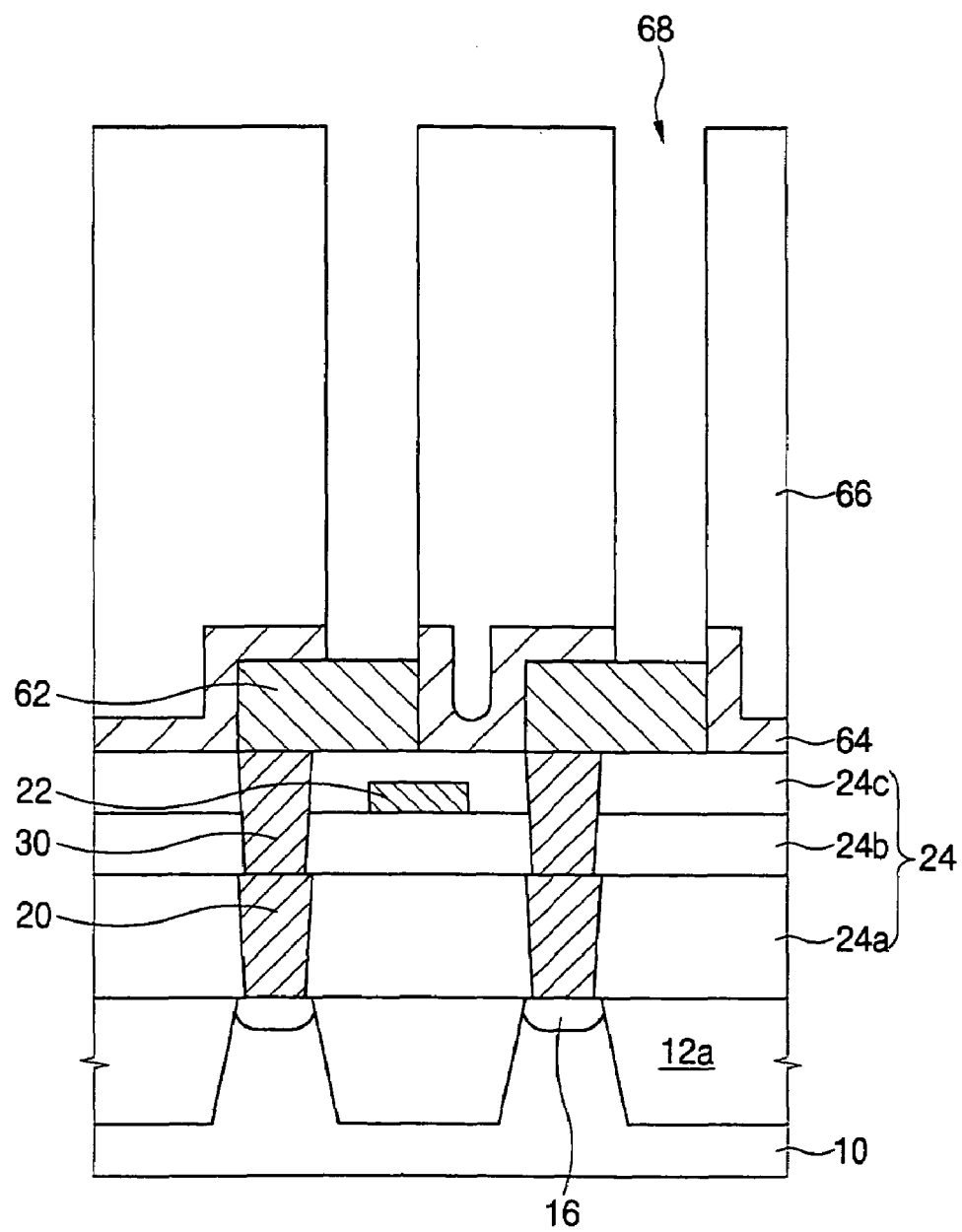

Referring to FIG. 4D, silicon nitride may be deposited on the buffer patterns 62 and the insulating layer 24 to form an etch stopping layer 64. A mold oxide layer 66 may then be formed on the etch stopping layer 64. A height of upper portions of subsequently formed cylindrical lower capacitor electrodes may be determined by a thickness of the mold oxide layer 66. Here, the mold oxide layer 66 may be formed having a thickness of greater than or equal to about 10000 Å. Referring to FIG. 4E, portions of the mold oxide layer 66 may be etched and then the etch stopping layer 64 may be etched to form first openings 68 exposing portions of the buffer patterns 62.

Positions of upper portions of a cylindrical lower capacitor electrodes are determined by positions of first openings 68. First openings 68 may be disposed to provide an increased interval between adjacent openings 68. The upper portions of the cylindrical lower capacitor electrodes may be formed to extend vertically from the second regions of the lower portions. A cylindrical lower capacitor electrode may thus include a lower portion having a first region contacting the storage contact 30 and a second region extending horizontally from the first region on the insulating layer 24. Intervals between adjacent upper portions of the lower capacitor electrodes may thus be increased.

Figure 4F:
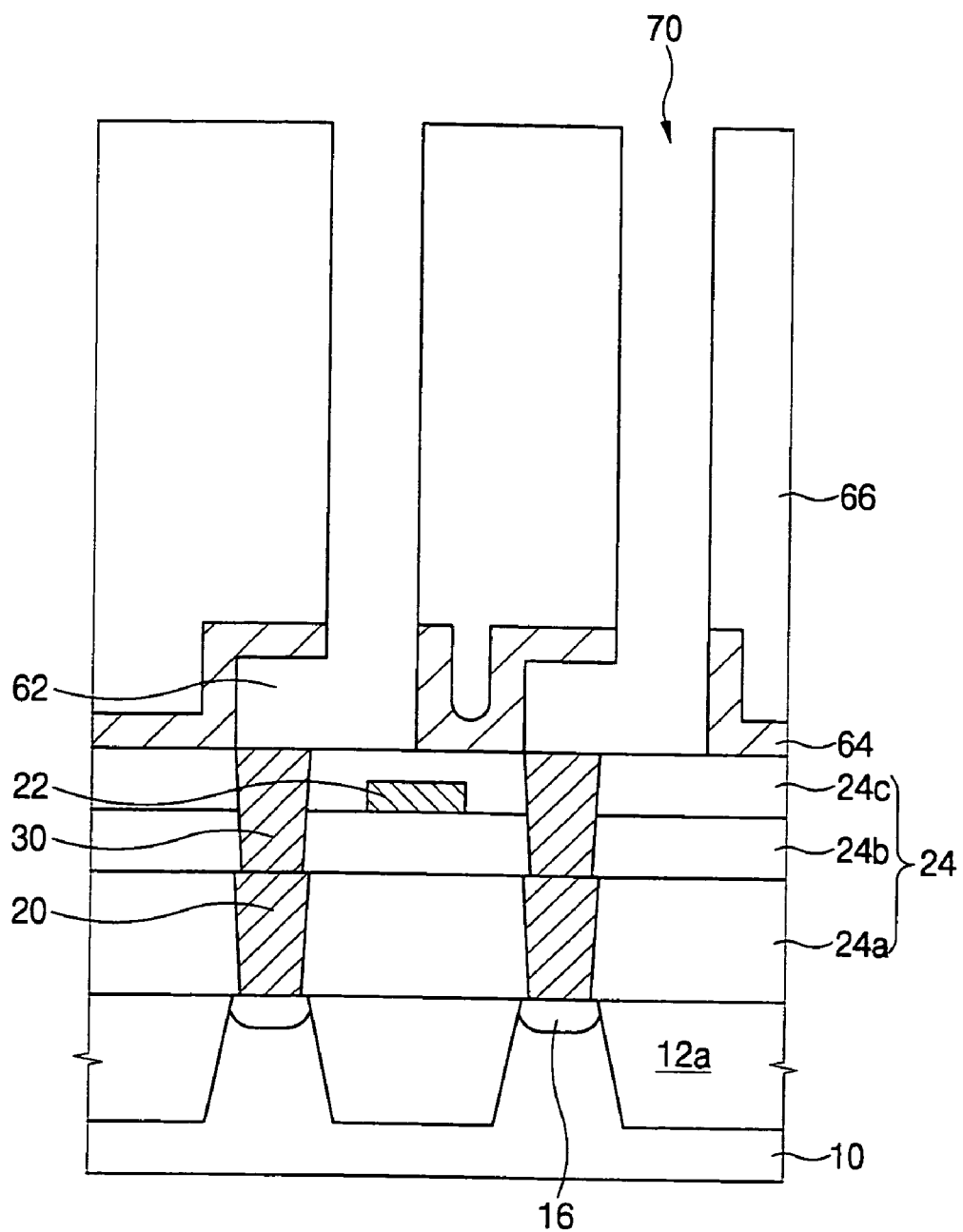

Referring to FIG. 4F, buffer patterns 62 exposed by first openings 68 may be selectively etched using an isotropic etching process to form second openings 70 having laterally extended lower portions. The isotropic etching process may be a wet etching process and/or a chemical dry etching process. If the buffer patterns 62 are formed using silicon germanium, the isotropic etching process may be performed using a wet etchant including hydrogen peroxide ($H_2O_2$) and acetic acid ($CH_3COOH$). Hydrogen fluoride (HF) may also be included in the wet etchant.

Figure 4G:
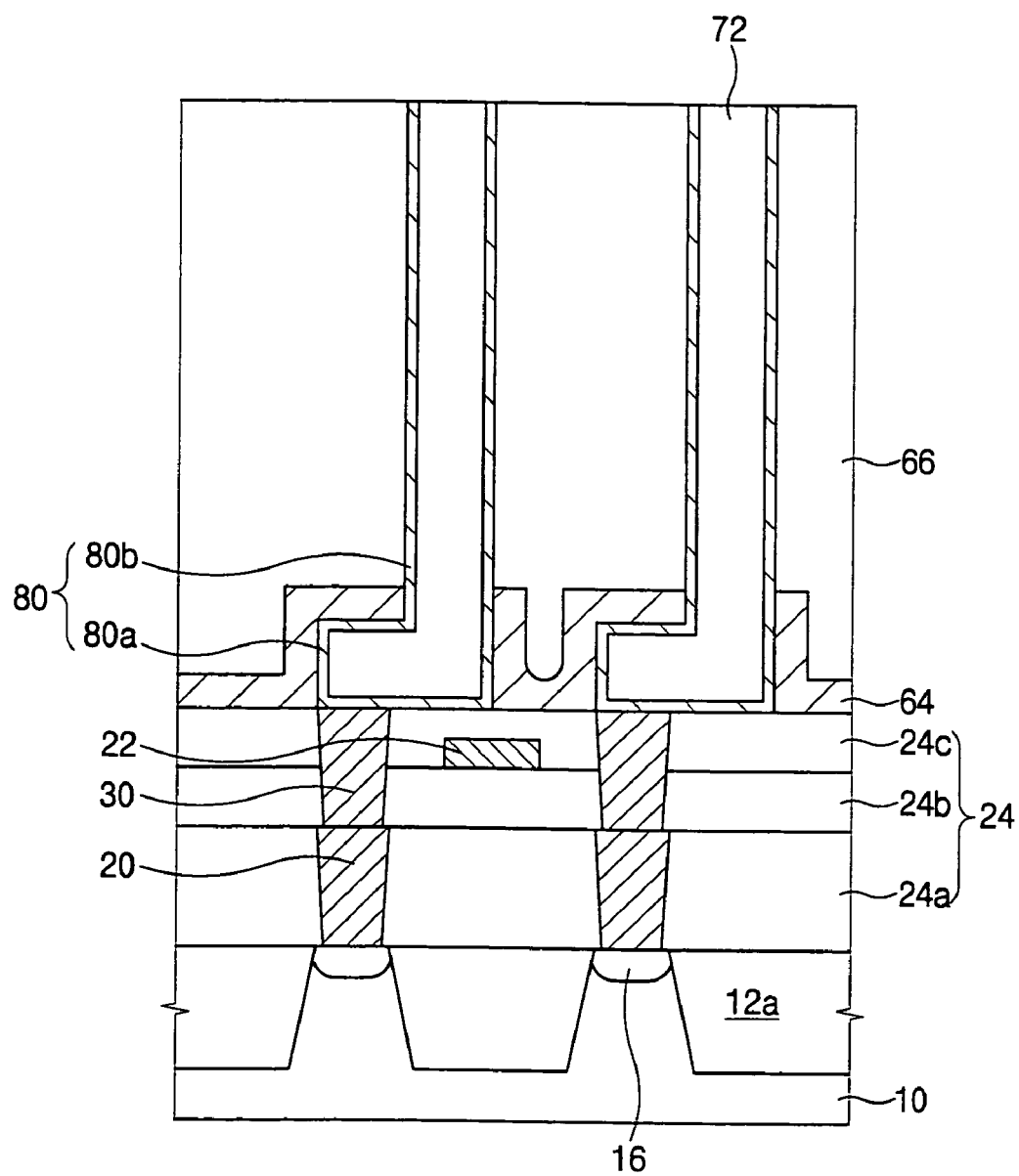

Referring to FIG. 4G, a lower capacitor electrode layer may be formed on inside surfaces of the second openings 70 and on the mold oxide layer 66. Then, a sacrificial oxide layer 72 may be formed to fill the second openings. The lower capacitor electrode layer may be formed on the inside of the second openings. The sacrificial oxide layer 72 and the lower electrode layer may be polished to remove portions of the lower electrode layer formed on the mold oxide layer 66 and to form cylindrical lower electrodes 80.

More particularly, each lower capacitor electrode 80 may include a lower portion 80a having a first region contacting a storage contact 30 and a second region extending horizontally from the first region on the insulating layer 24. An upper portion 80b may extend vertically from the second region of the lower portion 80a.

Figure 4H:
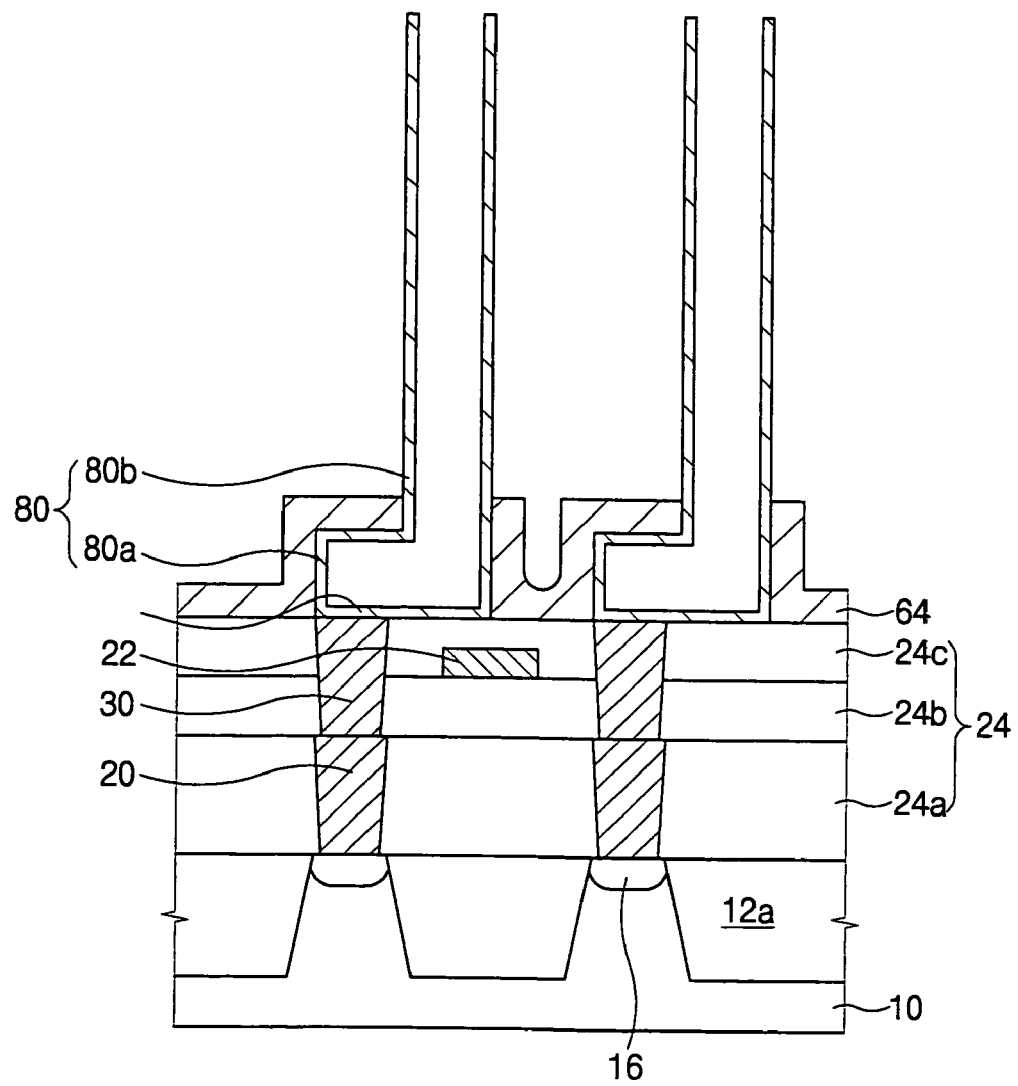
Figure 41:
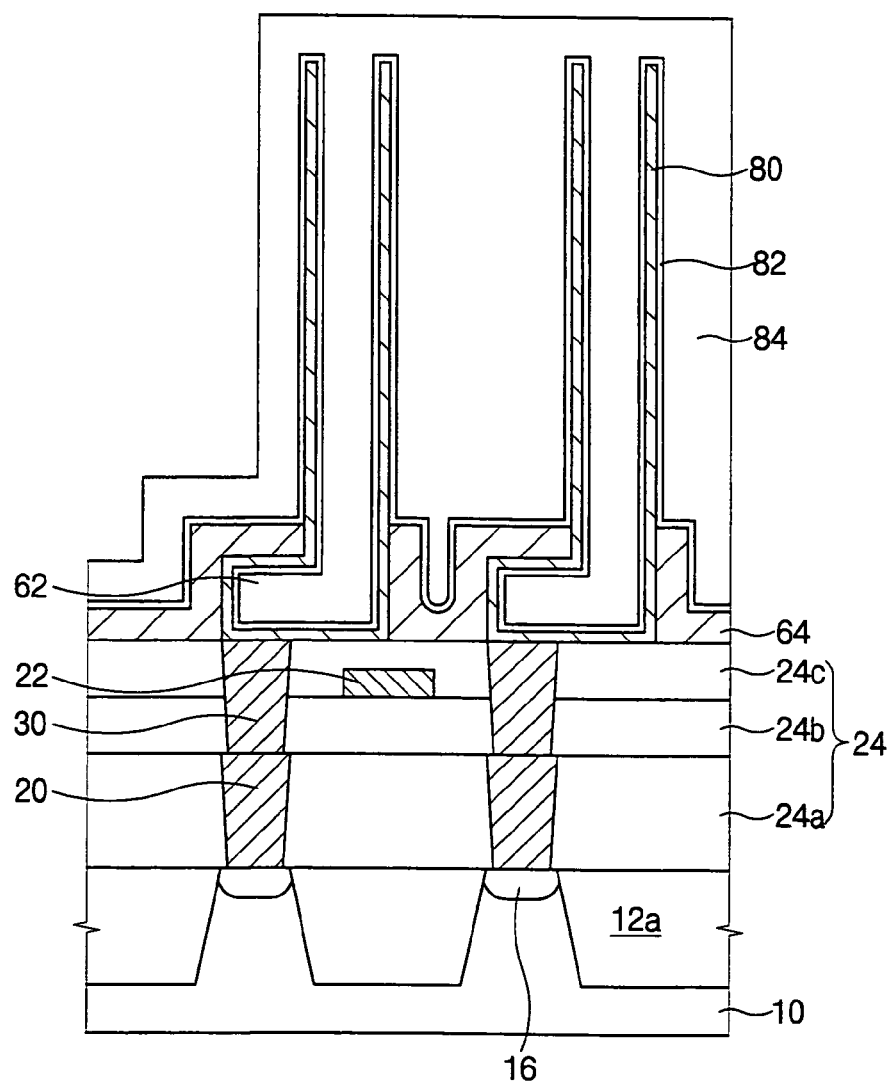

Referring to FIG. 4H, the sacrificial oxide layer 72 and the mold oxide layer 66 may be selectively etched using an isotropic etching process to expose the etch stopping layer 64. The isotropic etching process may include a wet etching process using an aqueous solution including hydrogen fluoride (HF) as an etchant. After performing the isotropic etching process, the etch stopping layer 64 may enclose the lower portions 80a of the lower electrodes 80 because the etch stopping layer 64 is formed on the lower portion 80a of the cylindrical lower electrode 80. Upper portions 80b of the cylindrical lower capacitor electrodes 80 may also be exposed.

Referring to FIG. 4I, a dielectric layer 82 may be formed on the exposed lower capacitor electrodes 80 and on the etch stopping layer 64. The upper capacitor electrode 84 may then be formed on the dielectric layer 82. According to methods discussed above, forming buffer patterns may be simplified.

FIGS. 5A to 5H are cross-sectional views illustrating steps for manufacturing capacitors of a DRAM device according to third embodiments of the present invention.

Figure 5A:
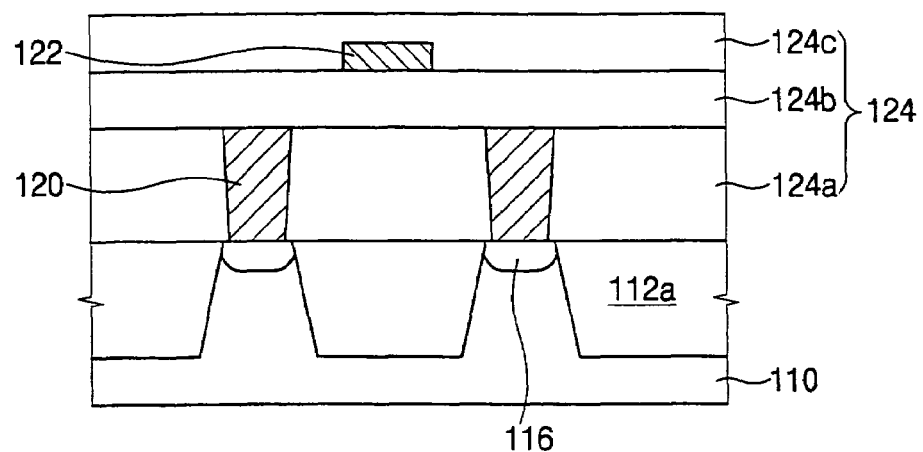
FIGS. 5A to 5H are cross-sectional views illustrating steps of manufacturing capacitors of DRAM devices according to third embodiments of the present invention.

Referring to FIG. 5A, a semiconductor substrate 110 may be divided into active regions and a field regions 112a using a device isolation process as discussed above with respect to FIG. 3A. Moreover, gate electrodes and source/drain regions 116 may be formed on the substance 110 to provide memory access transistors. An insulating layer 124a may be formed on the transistors. Moreover, pad electrodes 120 may be formed in via holes through the insulating layer 124a, and bit lines 122 may be formed on the insulating layer 124b.

Figure 5B:
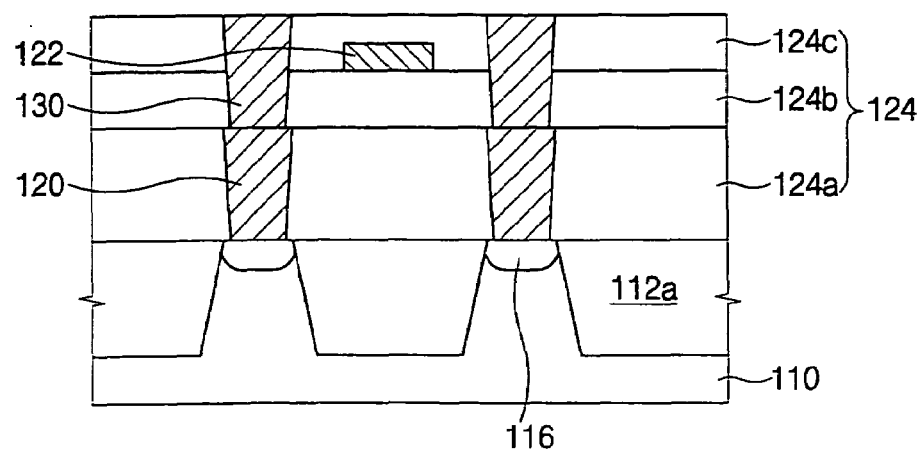

Referring to FIG. 5B, portions of the insulating layers 124b-c may be etched to form first openings exposing the pad electrodes 120 that are electrically connected to source regions 116.

A buffer layer may be formed on the insulating layer 124 to fill the first openings. The buffer layer may then be polished to remove portions of the layer from the insulating layer 124 so that buffer patterns 130 are formed. The buffer patterns 130 are thus formed instead of the storage contacts discussed above with respect to FIGS. 3A-K and 4A-I. A height of subsequently formed cylindrical lower capacitor electrodes may thus be increased by a thickness of the buffer patterns 130.

The buffer pattern 130 may include material having an etching selectivity of greater than or equal to about 100:1 with respect to silicon oxide. An etching selectivity between the buffer pattern 130 and silicon oxide may be greater than or equal to about 500:1. Thus, the buffer layer may be formed using silicon germanium.

Figure 5C:
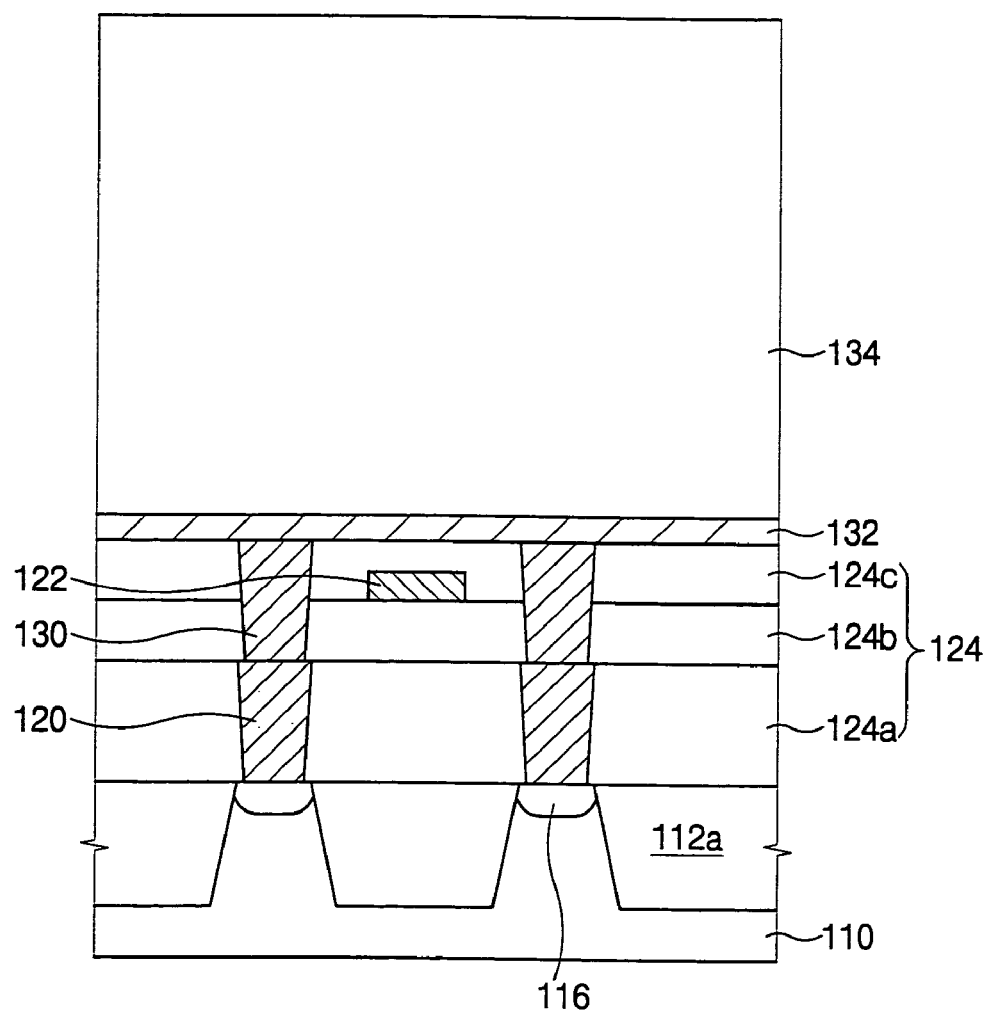

Referring to FIG. 5C. silicon nitride may be deposited to form an etch stopping layer 132 on the buffer pattern 130 and on the insulating layer 124. A mold oxide layer 134 may then be formed on the etch stopping layer 132. A height of upper portions of subsequently formed cylindrical lower capacitor electrodes may be determined by a thickness of the mold oxide layer 134.

Figure 5D:
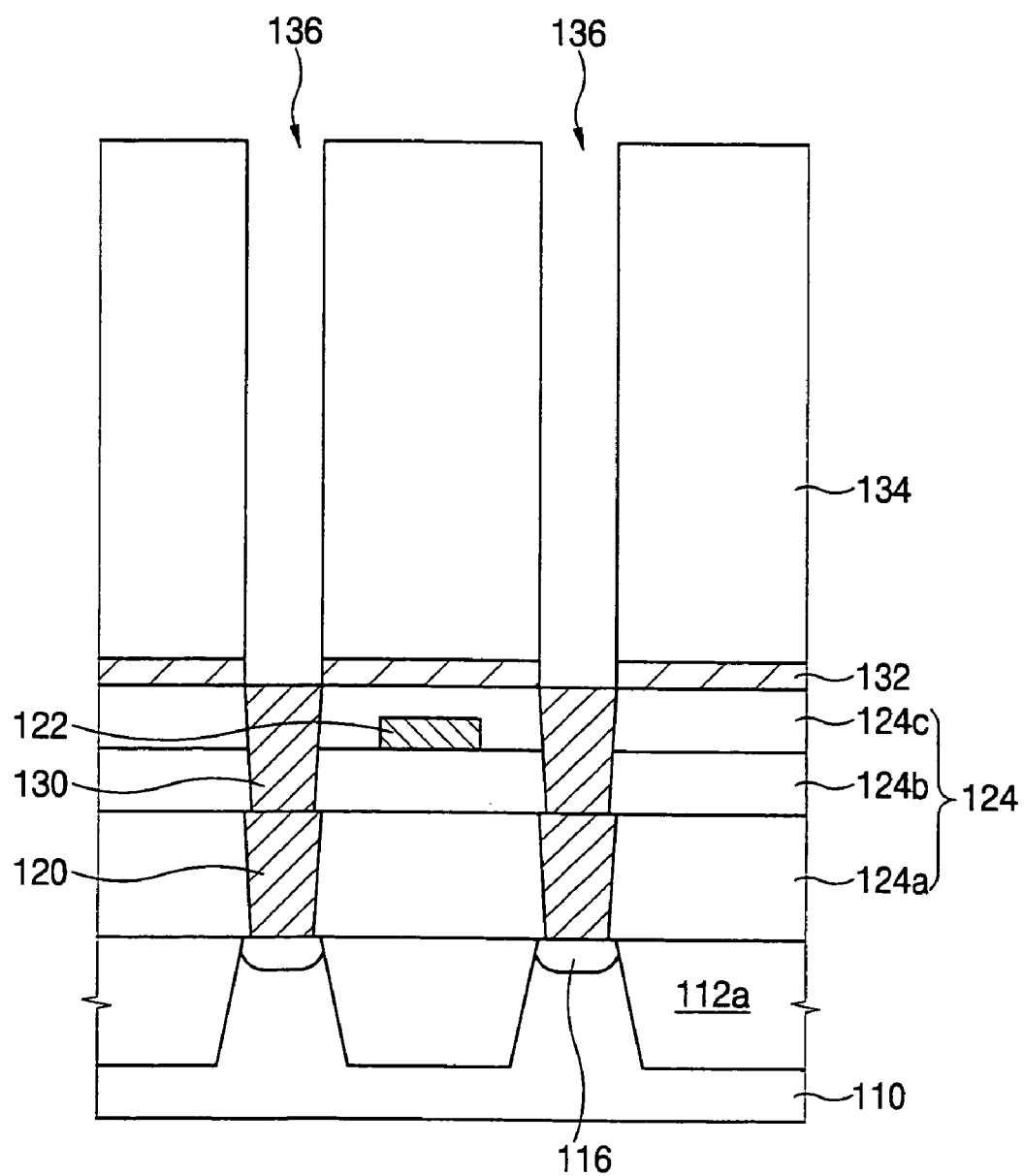

Referring to FIG. 5D, after portions of the mold oxide layer 134 are etched, portions of the etch stopping layer 132 may be etched to form second openings 136 exposing the buffer patterns 130. The second openings 136 may expose portions of the buffer patterns 130.

Figure 5E:
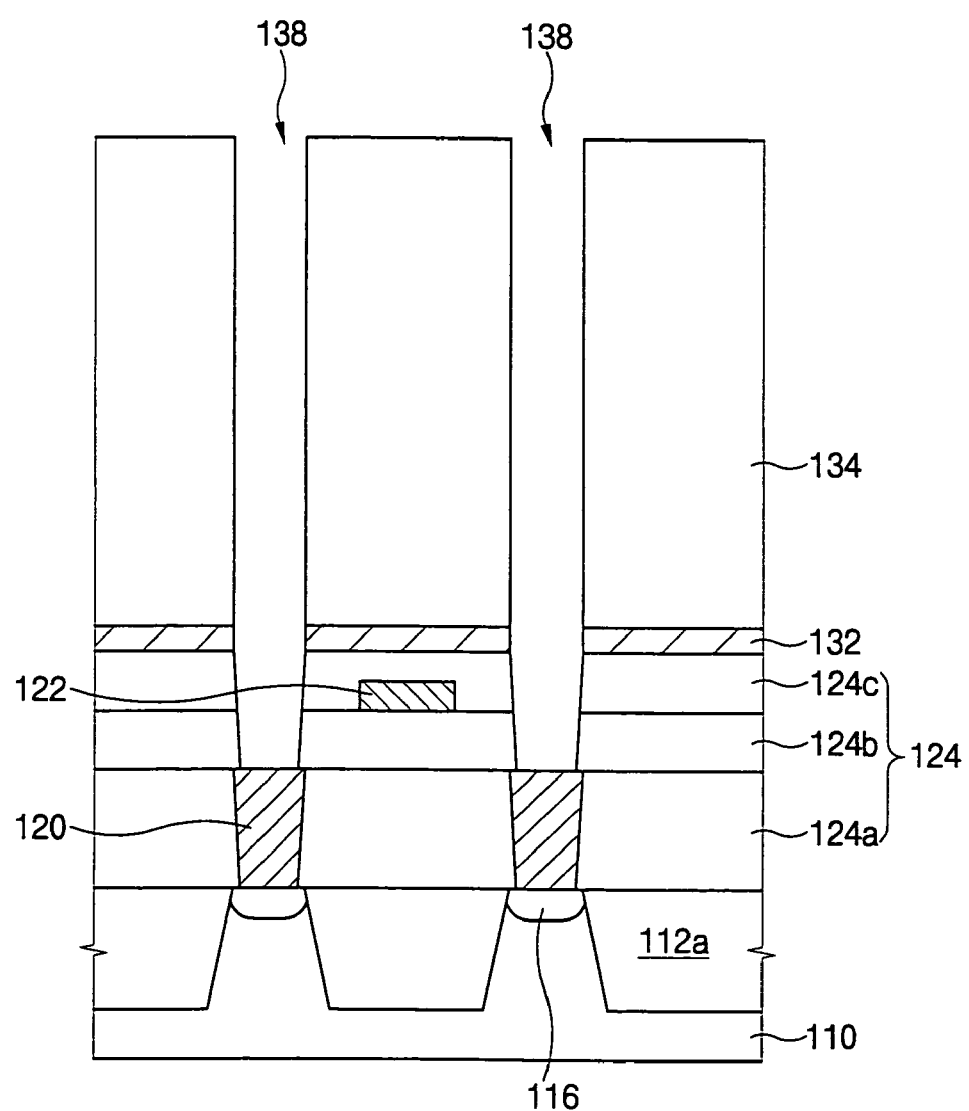

Referring to FIG. 5E, buffer patterns 130 exposed by the second openings 136 may be selectively etched using an isotropic etching process to form third openings 138 having a depth deeper than that of the second openings 136. The isotropic etching process may include a wet etching process and/or a chemical dry etching process. If the buffer pattern 130 is formed using silicon germanium, the isotropic etching process may be performed using a wet etchant including hydrogen peroxide ($H_2O_2$) and acetic acid ($CH_3COOH$). Hydrogen fluoride (HF) may also be included in the wet etchant.

Figure 5F:
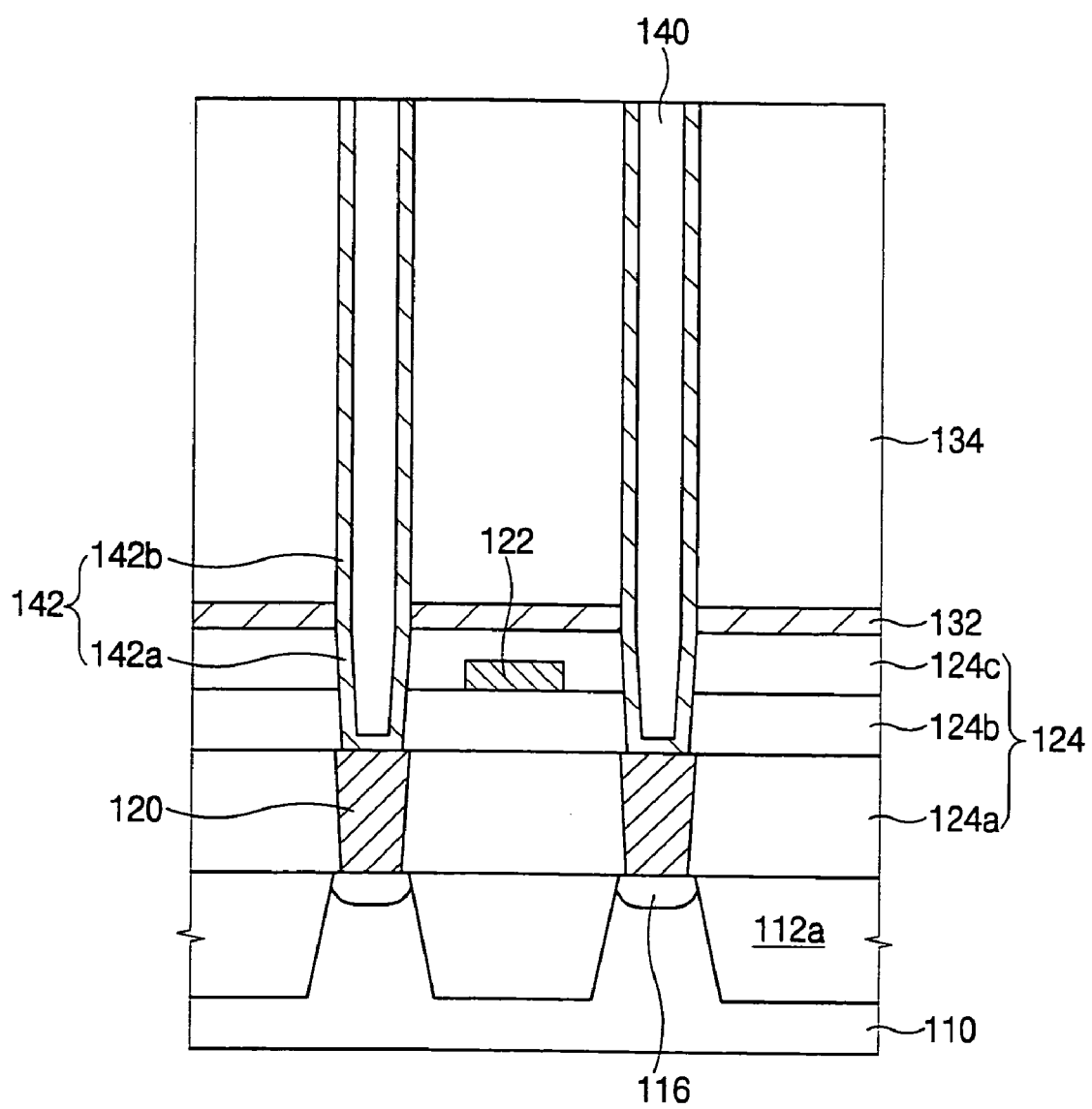

Referring to FIG. 5F, a lower capacitor electrode layer may be formed on inside surfaces of the third openings 138 and on the mold oxide layer 134. A sacrificial oxide layer 140 may be formed to fill the third openings 138. The sacrificial oxide layer 140 and the lower electrode layer may then be polished to expose portions of the mold oxide layer 134 to form cylindrical lower capacitor electrodes 142. More particularly, each lower capacitor electrode 142 may include a lower portion 142a having a first region contacting the pad electrode 120. Effective areas of the lower capacitor electrodes 142 may thus be increased.

Figure 5G:
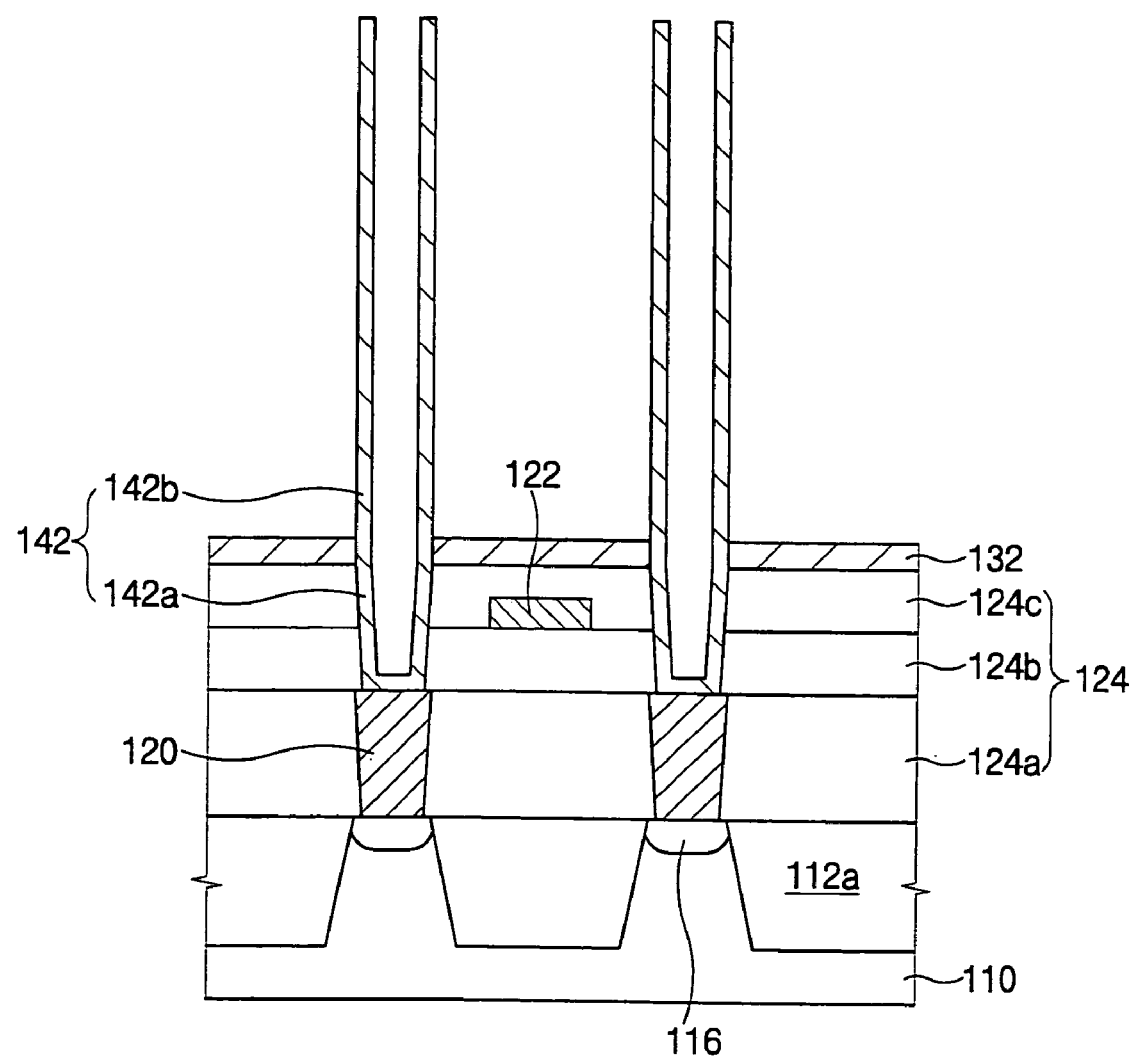

Referring to FIG. 5G, the sacrificial oxide layer 140 and the mold oxide layer 134 may be selectively etched using an isotropic etching process to expose the etch stopping layer 132. The isotropic etching process may include a wet etching process using an aqueous solution including hydrogen fluoride (HF) as an etchant. After performing the isotropic etching process, the insulating layer 124 and the etch stopping layer 132 may enclose the lower portions 142a of the cylindrical lower capacitor electrodes 142. Also, upper portions 142b of the cylindrical lower capacitor electrodes may be exposed.

Figure 5H:
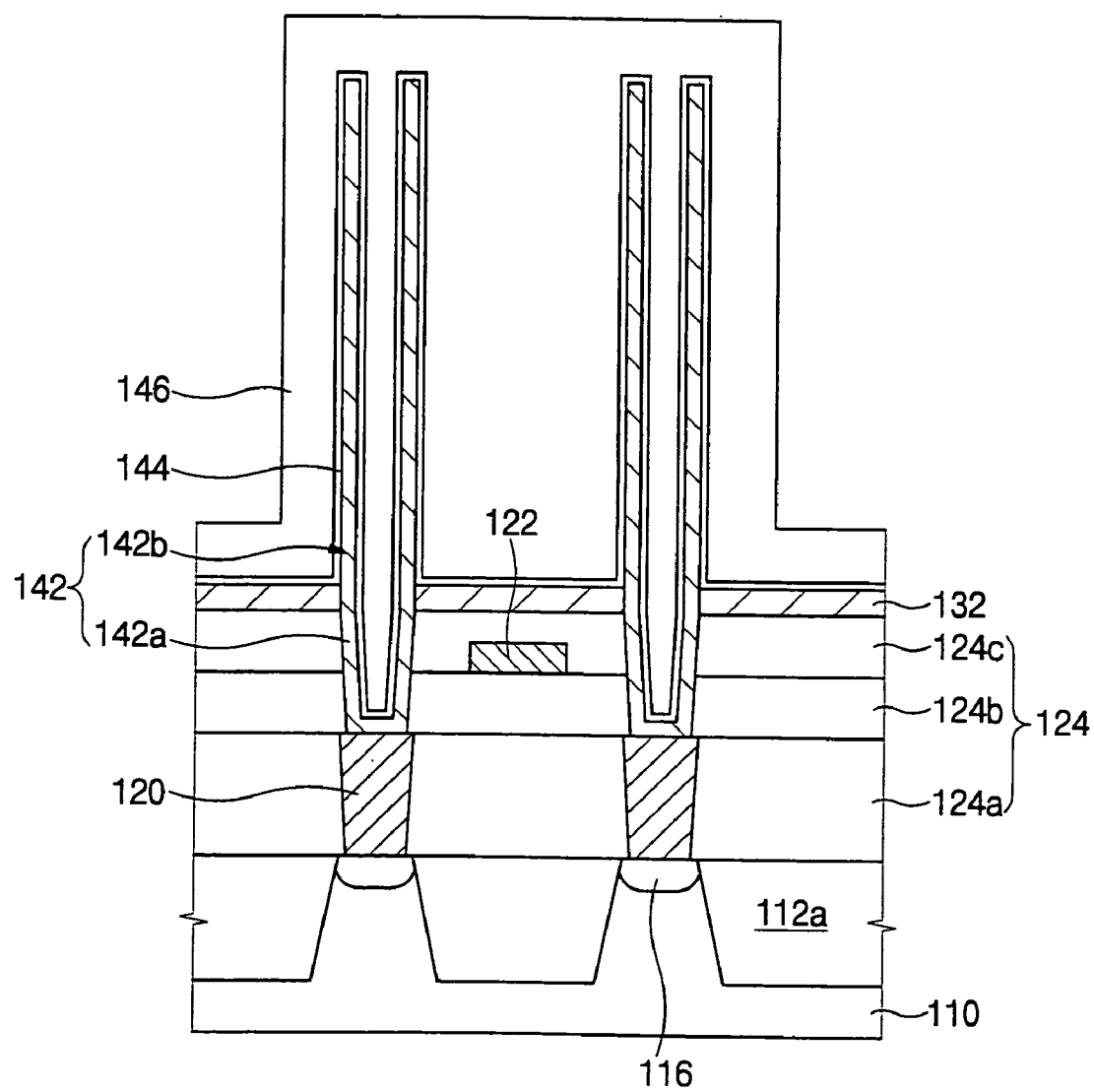

Referring to FIG. 5H, a dielectric layer 144 may be formed on exposed portions of lower capacitor electrodes 142 and the etch stopping layer 132. An upper electrode 146 may then be formed on the dielectric layer 120.

As a height of a capacitor of a semiconductor device formed as discussed above may be increased, capacitances of the resulting capacitors may be increased. Also, a structure of the cylindrical lower capacitor electrodes may be relatively stable so that leaning of the cylindrical lower capacitor electrodes may be reduced. Defects due to contact between upper portions of adjacent cylindrical lower capacitor electrodes may thus be reduced.

According to embodiments of the present invention, capacitance of a capacitor may be increased by increasing an effective area of the cylindrical lower capacitor electrode. Also, a structure of the cylindrical lower capacitor electrode may be relatively stable so that leaning of the cylindrical lower electrode may be reduced. Defects due to contact between upper portions of adjacent cylindrical lower capacitor electrodes may thus be reduced.

While the present invention has been particularly shown and described with reference to embodiments thereof, it will be understood by those skilled in the art that various changes in form and details may be made therein without departing from the spirit and scope of the invention as defined by the appended claims and their equivalents.

What is claimed is:

1. A method of forming a capacitor structure, the method comprising:

forming an insulating layer on a substrate;

forming a storage node contact through the insulating layer;

forming a first capacitor electrode on the insulating layer, the first capacitor electrode defining a cavity therein, wherein the cavity has a first portion parallel with respect to the substrate and a second portion perpendicular with respect to the substrate wherein the storage node contact provides electrical connection between the first capacitor electrode and the substrate, wherein the second portion of the cavity defined by the first capacitor electrode is laterally offset non-symmetrically with respect to the storage node contact in a direction parallel with respect to a surface of the substrate;

forming a capacitor dielectric layer on portions of the first capacitor electrode; and forming a second capacitor electrode on the capacitor dielectric layer such that the capacitor dielectric layer is between the first and second capacitor electrodes.

2. The method according to claim 1, wherein the second portion of the cavity extends away from the first portion of the cavity.

3. A method of forming a capacitor structure, the method comprising:

forming an insulating layer on a substrate;

forming a first capacitor electrode on the insulating layer, the first capacitor electrode defining a cavity therein, wherein the cavity has a first portion parallel with respect to the substrate and a second portion perpendicular with respect to the substrate wherein forming the first capacitor electrode comprises, forming a buffer pattern on the insulating layer, forming a mold layer on the buffer pattern, wherein the mold layer and the buffer pattern comprise different materials, forming a hole in the mold layer exposing a portion of the buffer pattern thereby defining a first cavity, after forming the hole in the mold layer, selectively removing the buffer pattern while maintaining the mold layer, thereby defining a second cavity coupled to the first cavity, forming the first capacitor electrode on inner surfaces of the first and second cavities, and after forming the first capacitor electrode, removing the mold layer;

forming a capacitor dielectric layer on portions of the first capacitor electrode; and forming a second capacitor electrode on the capacitor dielectric layer such that the capacitor dielectric layer is between the first and second capacitor electrodes.

4. The method according to claim 3, wherein forming the first capacitor electrode comprises:

forming a conductive layer on the inner surfaces of the first and second cavities and on a surface of the mold layer;

forming a sacrificial layer on the conductive layer inside the first and second cavities and on the surface of the mold layer;

removing portions of the sacrificial layer and the conductive layer to expose portions of the mold layer; and removing the mold layer and the sacrificial layer.

5. The method according to claim 3, wherein forming the buffer pattern comprises:

forming a buffer layer on the insulating layer; and patterning the buffer layer using photolithography.

6. The method according to claim 3, wherein forming the buffer pattern comprises:
- forming a silicon oxide layer on the insulating layer;
- removing portions of the silicon oxide layer, thereby exposing portions of the insulating layer;
- forming a buffer layer on the silicon oxide layer and on exposed portions of the insulating layer; and
- removing portions of the buffer layer to expose the silicon oxide layer while maintaining portions of the buffer layer on the insulating layer to provide the buffer pattern.

7. The method according to claim 3, wherein selectively removing the buffer pattern comprises isotropically etching the buffer pattern.

8. The method according to claim 7, wherein isotropically etching the buffer pattern comprises isotropically etching the buffer pattern using an etchant that provides an etching selectivity of at least about 100:1 for the buffer pattern with respect to the mold layer.

9. The method according to claim 3 wherein the buffer pattern comprises silicon germanium.

10. The method according to claim 3, wherein forming the mold layer is preceded by:
- forming an etch stopping layer on the buffer pattern wherein the etch stopping layer and the mold layer comprise different materials and wherein the etch stopping layer and the buffer pattern comprise different materials.

11. The method according to claim 10, wherein the etch stopping layer comprises silicon nitride.

12. The method according to claim 1, wherein the cavity of the first capacitor electrode is "L" shaped.

13. The method according to claim 1, wherein the second portion of the cavity defined by the first capacitor electrode is cylindrical.

14. The method according to claim 1, wherein forming the storage node contact precedes forming the first capacitor electrode.

15. The method according to claim 1, wherein the storage node contact provides electrical connection between the first capacitor electrode and a source/drain region of a memory cell access transistor.

16. A method of forming a capacitor structure, the method comprising:
- forming a memory cell access transistor on a substrate, wherein the memory cell access transistor includes first and second source/drain regions on the substrate;
- forming a first insulating layer on the substrate and on the memory cell access transistor;
- forming a bit line on the first insulating layer wherein the bit line is electrically connected to the first source/drain region of the memory cell access transistor;
- forming a second insulating layer on the bit line and on the first insulating layer so that the bit line is between the first and second insulating layers;
- forming a storage node contact through the first and second insulating layers wherein the storage node contact is electrically connected to the second source/drain region of the memory cell access transistor;
- after forming the storage node contact, forming a first capacitor electrode on the insulating layer, the first capacitor electrode defining a cavity therein, wherein the cavity has a first portion parallel with respect to the substrate and a second portion perpendicular with respect to the substrate wherein the storage node contact provides electrical connection between the first capacitor electrode and the second source/drain region of the memory cell access transistor;
- forming a capacitor dielectric layer on portions of the first capacitor electrode; and
- forming a second capacitor electrode on the capacitor dielectric layer such that the capacitor dielectric layer is between the first and second capacitor electrodes.

17. The method according to claim 16, wherein the second portion of the cavity defined by the first capacitor electrode is laterally offset non-symmetrically with respect to the storage node contact in a direction parallel with respect to a surface of the substrate.

18. A method of forming a capacitor structure, the method comprising:
- forming an insulating layer on a substrate;
- forming a buffer pattern on the insulating layer;
- forming a mold layer on the buffer pattern wherein the mold layer and the buffer pattern comprise different materials;
- forming a hole in the mold layer exposing a portion of the buffer pattern thereby defining a first cavity;
- after forming the hole in the mold layer, selectively etching the buffer pattern while maintaining the mold layer thereby defining a second cavity coupled to the first cavity, wherein the buffer layer is selectively etched using an etchant providing an etch selectivity of at least about 100 to 1 with respect to the mold oxide layer;
- forming a first capacitor electrode on inner surfaces of the first and second cavities;
- after forming the first capacitor electrode, removing the mold layer;
- forming a capacitor dielectric layer on portions of the first capacitor electrode; and
- forming a second capacitor electrode on the capacitor dielectric layer so that the capacitor dielectric layer is between the first and second capacitor electrodes.

19. The method according to claim 18, wherein the buffer pattern comprises silicon germanium.

20. The method according to claim 19, wherein the mold layer comprises oxide.

21. The method according to claim 1 wherein the first portion of the cavity is between the substrate and the second portion of the cavity, wherein the first portion of the cavity has a first dimension in a direction parallel with respect to the substrate, wherein the second portion of the cavity has a second dimension in the direction parallel with respect to the substrate, and wherein the first dimension is greater than the second dimension.

22. The method according to claim 1 wherein portions of the first capacitor electrode are between the second capacitor electrode and the substrate, and wherein portions of the first capacitor electrode are between different portions of the second capacitor electrode.

* * * * *